United States Patent
Ohnuki

(10) Patent No.: US 9,927,465 B2
(45) Date of Patent: Mar. 27, 2018

(54) VOLTAGE MEASURING DEVICE

(75) Inventor: Yasumichi Ohnuki, Utsunomiya (JP)

(73) Assignee: HONDA MOTOR CO., LTD., Tokyo (JP)

( * ) Notice: Subject to any disclaimer, the term of this patent is extended or adjusted under 35 U.S.C. 154(b) by 873 days.

(21) Appl. No.: 14/344,104

(22) PCT Filed: Jun. 12, 2012

(86) PCT No.: PCT/JP2012/064978
§ 371 (c)(1),
(2), (4) Date: Mar. 11, 2014

(87) PCT Pub. No.: WO2013/038762
PCT Pub. Date: Mar. 21, 2013

(65) Prior Publication Data
US 2014/0350878 A1   Nov. 27, 2014

(30) Foreign Application Priority Data

Sep. 14, 2011   (JP) .................................. 2011-200162

(51) Int. Cl.
*G01R 19/00* (2006.01)
*G01R 31/36* (2006.01)

(52) U.S. Cl.
CPC ....... *G01R 19/0084* (2013.01); *G01R 31/362* (2013.01); *G01R 31/3627* (2013.01); *G01R 31/3658* (2013.01)

(58) Field of Classification Search
CPC ............................ H02H 9/042; G01R 19/0084
(Continued)

(56) References Cited

U.S. PATENT DOCUMENTS 8,258,792 B2 * 9/2012 Vandensande ........ H02J 7/0021
320/162
2001/0026161 A1   10/2001 Furukawa
(Continued)

FOREIGN PATENT DOCUMENTS

JP   2001-289886 A   10/2001
JP   2002-343445 A   11/2002
(Continued)

OTHER PUBLICATIONS

Onuki Taido; "Voltage detecting for battery modules" (English translation JP2010-181168) (5 Pages), date: Aug. 2010.*
(Continued)

*Primary Examiner* — John Breene
*Assistant Examiner* — Kaleria Knox
(74) *Attorney, Agent, or Firm* — Squire Patton Boggs (US) LLP

(57) ABSTRACT

Provided is a voltage measuring device capable of increasing the degree of freedom in the design of an RC filter (low-pass filter) while suppressing the withstand voltage limit of a capacitor. The voltage measuring device comprises: at least one divided capacitor group having a plurality of divided capacitors connected in series through measurement nodes and having one end connected to a reference node and the other end connected to a non-reference node; and at least one non-divided capacitor having one end connected to the reference node and the other end connected to a non-reference node to which the divided capacitors are not connected.

5 Claims, 23 Drawing Sheets

(58) Field of Classification Search
USPC .................................. 320/162, 136; 702/64
See application file for complete search history.

(56) References Cited

U.S. PATENT DOCUMENTS

| | | | |
|---|---|---|---|
| 2002/0079865 A1* | 6/2002 | Thomas | H02H 9/042 320/136 |
| 2004/0041569 A1 | 3/2004 | Furukawa | |
| 2007/0029967 A1 | 2/2007 | Morimoto | |
| 2008/0203976 A1 | 8/2008 | Ooishi et al. | |
| 2009/0295398 A1 | 12/2009 | Ohnuki | |
| 2009/0309545 A1 | 12/2009 | Kunimitsu | |
| 2010/0073004 A1 | 3/2010 | Miyamoto | |
| 2013/0057294 A1 | 3/2013 | Mizoguchi et al. | |

FOREIGN PATENT DOCUMENTS

| | | |
|---|---|---|
| JP | 2005-003618 A | 1/2005 |
| JP | 2006-153758 A | 6/2006 |
| JP | 2007-40842 A | 2/2007 |
| JP | 2007-240299 A | 9/2007 |
| JP | 2008-275323 A | 11/2008 |
| JP | 2009-150867 A | 7/2009 |
| JP | 2010-025925 A | 2/2010 |
| JP | 2010-78390 A | 4/2010 |
| JP | 2010-181168 A | 8/2010 |
| JP | 2011-069639 A | 4/2011 |
| JP | 2011-185941 A | 9/2011 |
| JP | 2013-053884 A | 3/2013 |
| JP | 2013-53939 A | 3/2013 |
| WO | 2010/106141 A1 | 9/2010 |

OTHER PUBLICATIONS

Japanese Office Action application No. 2013-533544 dated Jul. 29, 2014.
Japanese Notice of Allowance application No. 2013-533544 dated Nov. 11, 2014.
International Search Report dated Sep. 18, 2012 corresponding to International Patent Application No. PCT/JP2012/064978 and English translation thereof.

* cited by examiner

FIG. 6    10a (FIRST INVENTIVE EXAMPLE)

FIG. 20    10d (FOURTH INVENTIVE EXAMPLE)

VOLTAGE MEASURING DEVICE

TECHNICAL FIELD

The present invention relates to a voltage measuring device for measuring a voltage across a battery assembly having a plurality of series-connected battery modules each of which is made up of at least one cell.

BACKGROUND ART

There have been developed voltage measuring devices for measuring a voltage across a battery assembly having a plurality of series-connected cells or battery modules. See, Japanese Laid-Open Patent Publication No. 2005-003618 (hereinafter referred to as "JP2005-003618A"), Japanese Laid-Open Patent Publication No. 2007-240299 (hereinafter referred to as "JP2007-240299A"), and U.S. Patent Application Publication No. 2008/0203976 (hereinafter referred to as "US2008/0203976A1").

The object of JP2005-003618A is to provide a power supply voltage measuring device for measuring accurate output voltages by correcting crosstalk (mutual voltage interference) between cells, which occurs in output voltages measured across respective cells due to an additional component that is shared by the cells (paragraph [0005], Abstract).

To achieve the above object, according to JP2005-003618A, opposite ends of a battery 2, which is made up of a plurality of cells 2a through 2e, and junctions between the cells 2a through 2e are connected to respective resistors 5a through 5f, which are connected in pairs through respective capacitors 6a through 6e. The output voltages across the respective cells 2a through 2e are measured through filters that share, among the cells 2a through 2e, the resistors connected to the junctions between the cells 2a through 2e. The power supply voltage measuring device includes a voltage detecting means, having photoMOS relays 7a through 7f and a voltage measuring circuit 8 for detecting voltages across the capacitors 6a through 6e corresponding respectively to the cells 2a through 2e, and a high voltage measuring CPU 1. Based on changes per unit time in the voltages across the capacitors 6a through 6e, the high voltage measuring CPU 1 calculates output voltages across the respective cells 2a through 2e before the voltages across the capacitors 6a through 6e change (Abstract). The power supply voltage measuring device is premised on the fact that the resistors 5a through 5f have identical resistance values, and the capacitors 6a through 6e have identical capacitance values (paragraph [0019]).

According to JP2007-240299A, a task is performed to provide a voltage measuring device, which is capable of increasing noise resistance thereof without delaying the measurement time (paragraph [0022], Abstract). To accomplish this task, according to JP2007-240299A, the resistance of one Rf1 of a pair of resistors Rf1, Rf2, which are connected to the first and (N+1)th voltage detecting terminals of (N+1) voltage detecting terminals, is set to a value smaller than the resistance value of the other resistor Rf2, and the total resistance value of the pair of resistors is set to an equal value in all of a plurality of filters (claim 1, Abstract). The resistances of the resistors Rf1, Rf2 are set to the relationships, Rf1+Rf2=2Rf and Rf1<<Rf2, e.g., Rf=10 kΩ, Rf1=1 kΩ, Rf2=19 kΩ. An electrostatic capacitance of a capacitor Cf, which cooperates with the resistors Rf1, Rf2 to make up an RC filter, is set to 4.7 μF (paragraph [0036]).

US2008/0203976A1 shows an arrangement in which an RC filter is used, which is made up of a plurality of resistors and a capacitor for each of cells BT1 through BT12 (FIG. 1). The patent does not refer to the resistance values of the resistors or the electrostatic capacitance of the capacitor.

SUMMARY OF INVENTION

As described above, the voltage measuring device disclosed in JP2005-003618A includes so-called RC filters, which are made up of the resistors 5a through 5f and the capacitors 6a through 6e. The voltage measuring device is premised on the fact that the resistors 5a through 5f have identical resistance values, and the capacitors 6a through 6e have identical capacitance values. Therefore, the RC filters disclosed in JP2005-003618A have different filter frequency characteristics for respective measurement channels. The voltage detecting devices disclosed in JP2007-240299A and US2008/0203976A1 also have different filter frequency characteristics for respective measurement channels. Furthermore, according to each of the above documents, since the capacitors must all be connected in series, the layout of the capacitors is limited, thus lowering the degree of design freedom.

In order to equalize the filter frequency characteristics for the respective measurement channels, a voltage measuring device 500B, as shown in FIG. 10 of the accompanying drawings, for example, may possibly be provided. The voltage measuring device 500B, which will be described later as a second comparative example, has RC filters, which are made up of resistors 30a through 30j (hereinafter collectively referred to as "resistors 30") and capacitors 32a through 32j (hereinafter collectively referred to as "capacitors 32"). The RC filters are provided independently in association with respective battery modules 16a through 16j. The resistors 30 have respective equal resistance values of 100Ω, and the capacitors 32 have respective equal capacitance values of 1 μF.

With the arrangement shown in FIG. 10, the voltage applied to each of the capacitors 32 becomes greater as the number of series-connected battery modules 16 increases. Further, in the example shown in FIG. 10, a highest voltage is applied to the capacitor 32j. Consequently, the arrangement shown in FIG. 10 requires that the capacitors 32 to which higher voltages are applied are capacitors having higher withstand voltage limits.

The present invention has been made in view of the aforementioned problems. It is an object of the present invention to provide a voltage measuring device, which is capable of increasing the degree of design freedom for the RC filters (low-pass filters), while also lowering withstand voltage limits for the capacitors.

According to the present invention, there is provided a voltage measuring device for measuring a voltage across a battery assembly having a plurality of series-connected battery modules each of which is made up of at least one cell, comprising a plurality of measurement nodes including at least one reference node, which is maintained at a reference potential and is connected to one of the battery modules without being connected thereto through a resistor, and non-reference nodes other than the reference node, a plurality of voltage detector sections connected between adjacent ones of the measurement nodes in terms of potential magnitudes, a plurality of resistors having respective ends connected to the non-reference nodes and respective other ends connected to junctions between the battery modules or to opposite ends of the battery assembly, at least one dividing capacitor group having a plurality of dividing capacitors connected in series through the measurement nodes, and having an end connected to the reference node and another end connected to one of the non-reference nodes, and at least one non-dividing capacitor having an end connected to the reference node and another end connected to one of the non-reference nodes to which the dividing capacitors are not connected.

According to the present invention, it is possible to increase the degree of freedom with which the RC filters (low-pass filters) are designed, while at the same time lowering withstand voltage limits for the capacitors.

More specifically, according to the present invention, the voltage measuring device includes a dividing capacitor group having a plurality of dividing capacitors, which are connected in series through measurement nodes. Thus, compared with an arrangement in which all of the capacitors are non-dividing capacitors, it is possible to reduce withstand voltage limits for the dividing capacitors that make up the dividing capacitor group.

Furthermore, according to the present invention, the capacitors included in the RC filters associated with respective battery modules can independently be placed as non-dividing capacitors, or as dividing capacitors which are included in the dividing capacitor group. Consequently, it is possible to increase the degree of freedom with which the capacitors can be placed, compared with an arrangement in which all of the capacitors are placed in series, i.e., an arrangement having only one dividing capacitor group free of non-dividing capacitors.

If it is assumed that product of the electrostatic capacitance of the non-dividing capacitor and a resistance value of one of the resistors, which is connected to the non-dividing capacitor to make up a low-pass filter, serves as a predetermined time constant τ, with respect to the at least one dividing capacitor group, number of the dividing capacitors is represented by n, an integer ranging from 2 to n−1 is represented by m, an integer ranging from 1 to n is represented by q, number of the dividing capacitors from the reference node to one of the dividing capacitors in question is represented by $k_q$, number of the non-reference nodes from the reference node to one of the non-reference nodes, which is connected to a terminal of a $k_q$th one of the dividing capacitors remote from the reference node, is represented by $L_{kq}$, electrostatic capacitance of the $k_q$th one of the dividing capacitors is represented by $C_{kq}$, and a resistance value of one of the resistors, which is connected to the $k_q$th one of the dividing capacitors, is represented by $R_{kq}$, then the electrostatic capacitance $C_{kq}$ of each of the dividing capacitors satisfies the following inequalities (1) and (2), and the resistance value $R_{kq}$ of each of the resistors satisfies the following equations (3) through (5):

$$C_{k1} > C_{k2} \cdot \frac{(L_{k2} - L_{k1})}{L_{k1}} \quad (1)$$

$$C_{km} > C_{k(m+1)} \cdot \frac{(L_{k(m+1)} - L_{km})}{(L_{km} - L_{k(m-1)})} \quad (2)$$

$$R_{k1} = \frac{\tau}{C_{k1} \cdot \left\{ C_{k2} \cdot \frac{(L_{k2} - L_{k1})}{L_{k1}} \right\}} \quad (3)$$

$$R_{km} = \frac{\tau}{C_{km} \cdot \left\{ \frac{(L_{km} - L_{k(m-1)})}{L_{km}} \right\} - C_{k(m+1)} \cdot \left\{ \frac{(L_{k(m-1)} - L_{km})}{L_{km}} \right\}} \quad (4)$$

$$R_{kn} = \frac{\tau}{C_{kn} \cdot \left\{ \frac{(L_{kn} - L_{k(n-1)})}{L_{kn}} \right\}} \quad (5)$$

Consequently, it is possible to make the frequency characteristics of the RC filters uniform. More specifically, with respect to the non-dividing capacitors and the resistors, which are paired with the non-dividing capacitors to make up the RC filters, the product of the electrostatic capacitances of the non-dividing capacitors and the resistance values of the resistors serves as a time constant τ. Since the electrostatic capacitances of the dividing capacitors satisfy inequalities (1) and (2) and the resistance values of the resistors, which are paired with the dividing capacitors to make up the RC filters, satisfy equations (3) through (5), the time constant τ of each of the RC filters is constant. Consequently, the RC filters including any of the non-dividing capacitors and the dividing capacitors have uniform filter frequency characteristics (filter time constants).

The electrostatic capacitances $C_{kq}$ of the dividing capacitors also satisfy inequalities (1) and (2). Therefore, taking into account the term "$(L_{k2}-L_{k1})/L_{k1}$" in inequality (1) and the term "$(L_{k(m+1)}-L_{km})/(L_{km}-L_{k(m-1)})$" in inequality (2), it is possible to give the electrostatic capacitances of the dividing capacitors a relative degree of freedom, and to use inexpensive general-purpose capacitors as the dividing capacitors. For example, it is possible to equalize the electrostatic capacitances of the dividing capacitors by setting "$(L_{k2}-L_{k1})/L_{k1}$" in inequality (1) and "$(L_{k(m+1)}-L_{km})/(L_{km}-L_{k(m-1)})$" in inequality (2) to numerical values greater than 0 and less than or equal to 1.

On the other hand, compared with the choices available for the electrostatic capacitances of general-purpose capacitors, the choices available for the resistance values of general-purpose resistors are greater. Trimmer resistors, the resistance values of which are adjustable as desired, are also generally available. In addition, it is easy to adjust the resistance values by combining series-connected resistors and parallel-connected resistors. Consequently, it is easier to satisfy equations (3) through (5) for the resistors than to select the capacitors, thereby making it possible to minimize the cost of the voltage measuring device.

According to the present invention, there also is provided a voltage measuring device for measuring a voltage across a battery assembly having a module array made up of a plurality of series-connected battery modules each of which is made up of at least one cell, comprising a voltage detecting unit for detecting voltages across the battery modules, the voltage detecting unit being connected to positive and negative pole sides of the battery modules through at least as many lines as number of the battery modules +1, the lines being connected to junctions between the battery modules and opposite ends of the module array, as many resistors as the number of the battery modules, the resistors being connected to as many lines as the number of the battery modules, among the at least as many lines as the number of the battery modules +1, and as many capacitors as the number of the battery modules, which are combined with the resistors to make up RC filters, wherein the capacitors include at least one first capacitor connected in series to other capacitors, and a plurality of second capacitors connected in series to other capacitors, the second capacitors being combined into at least one series-connected capacitor group, the first capacitor has an end connected through one of the lines to a particular pole side as a positive or negative pole side of the battery modules, the first capacitor has another end connected to a reference line as one of the lines, which is free of any of the resistors, the second capacitors have ends connected to particular pole sides or to opposite sides of the battery modules through certain ones of the lines, and one of the second capacitors, which is closest to the reference line, of the at least one series-connected capacitor group has another end connected to the reference line, and the others of the second capacitors have other ends, which are connected to the ends of the second capacitors on non-reference lines that serve as other lines apart from the reference line.

According to the present invention, it is possible to increase the degree of freedom with which the RC filters (low-pass filters) are designed, while at the same time lowering withstand voltage limits for the capacitors.

More specifically, according to the present invention, the voltage measuring device includes a series-connected capacitor group having a plurality of series-connected capacitors (second capacitors). Thus, it is possible to reduce the withstand voltage limits for the capacitors (second capacitors) that make up the series-connected capacitor group, compared with an arrangement in which all of the capacitors are capacitors (first capacitors), which are not connected in series to other capacitors.

Furthermore, according to the present invention, the capacitors included in the RC filters associated with respective battery modules can independently be placed as first capacitors, which are not connected in series to other capacitors, or as second capacitors, which are included in the series-connected capacitor group. Consequently, it is possible to increase the degree of freedom with which the capacitors can be placed, compared with an arrangement in which all of the capacitors are placed in series, i.e., an arrangement having only one series-connected capacitor group free of first capacitors.

If it is assumed that each of the RC filters has a time constant represented by a particular value $\tau$, product of the electrostatic capacitance of the first capacitor and a resistance value of one of the resistors, which is paired with the first capacitor, is represented by $\tau$, with respect to the one series-connected capacitor group, number of the second capacitors is represented by n, an integer ranging from 2 to n−1 is represented by m, an integer ranging from 1 to n is represented by q, number of the second capacitors from the reference line to one of the second capacitors in question is represented by $k_q$, number of the non-reference lines from the reference line to one of the non-reference lines, which is connected to a terminal of a $k_q$th one of the second capacitors remote from the reference line, is represented by $L_{kq}$, electrostatic capacitance of the $k_q$th one of the second capacitors is represented by $C_{kq}$, and a resistance value of one of the resistors, which is connected to the $k_q$th one of the second capacitors, is represented by $R_{kq}$, then the electrostatic capacitance $C_{kq}$ of each of the second capacitors satisfies the following inequalities (6) and (7), and the resistance value $R_{kq}$ of each of the resistors satisfies the following equations (8) through (10):

$$C_{k1} > C_{k2} \cdot \frac{(L_{k2} - L_{k1})}{L_{k1}} \tag{6}$$

$$C_{km} > C_{k(m+1)} \cdot \frac{(L_{k(m+1)} - L_{km})}{(L_{km} - L_{k(m-1)})} \tag{7}$$

-continued $$R_{k1} = \frac{\tau}{C_{k1} - \left\{C_{k2} \cdot \frac{(L_{k2} - L_{k1})}{L_{k1}}\right\}} \tag{8}$$

$$R_{km} = \frac{\tau}{C_{km} \cdot \left\{\frac{(L_{km} - L_{k(m-1)})}{L_{km}}\right\} - C_{k(m+1)} \cdot \left\{\frac{(L_{k(m-1)} - L_{km})}{L_{km}}\right\}} \tag{9}$$

$$R_{kn} = \frac{\tau}{C_{kn} \cdot \left\{\frac{(L_{kn} - L_{k(n-1)})}{L_{kn}}\right\}} \tag{10}$$

Consequently, it is possible to make the frequency characteristics of the RC filters uniform. More specifically, with respect to the first capacitors and the resistors, which are paired with the first capacitors to make up the RC filters, the product of the electrostatic capacitances of the first capacitors and the resistance values of the resistors serves as a time constant $\tau$. Since the electrostatic capacitances of the second capacitors satisfy inequalities (6) and (7) and the resistance values of the resistors, which are paired with the second capacitors to make up the RC filters, satisfy equations (8) through (10), the time constant $\tau$ of each of the RC filters is constant. Consequently, the RC filters including any of the first capacitors and the second capacitors have uniform filter frequency characteristics (filter time constants).

The electrostatic capacitances $C_{kq}$ of the second capacitors may also satisfy inequalities (6) and (7). Therefore, taking into account the term "$(L_{k2}-L_{k1})/L_{k1}$" in inequality (6) and the term "$(L_{k(m+1)}-L_{km})/(L_{km}-L_{k(m-1)})$" in inequality (7), it is possible to give the electrostatic capacitances of the second capacitors a relative degree of freedom, and to use inexpensive general-purpose capacitors as the second capacitors. For example, it is possible to equalize the electrostatic capacitances of the second capacitors by setting "$(L_{k2}-L_{k1})/L_{k1}$" in inequality (6) and "$(L_{k(m+1)}-L_{km})/(L_{km}-L_{k(m-1)})$" in inequality (7) to a numerical value greater than 0 and less than or equal to 1.

On the other hand, compared with the choices available for the electrostatic capacitances of general-purpose capacitors, the choices available for the resistance values of general-purpose resistors are greater. Trimmer resistors, the resistance values of which are adjustable as desired, are also generally available. In addition, it is easy to adjust the resistance values by combining series-connected resistors and parallel-connected resistors. Consequently, it is easier to satisfy equations (8) through (10) by selecting the resistors than by selecting the capacitors, thereby making it possible to minimize the cost of the voltage measuring device.

DESCRIPTION OF EMBODIMENTS

A. First Embodiment (Arrangement in which Two RC Filters are Combined)

A-1. Overall Arrangement

Figure 1:
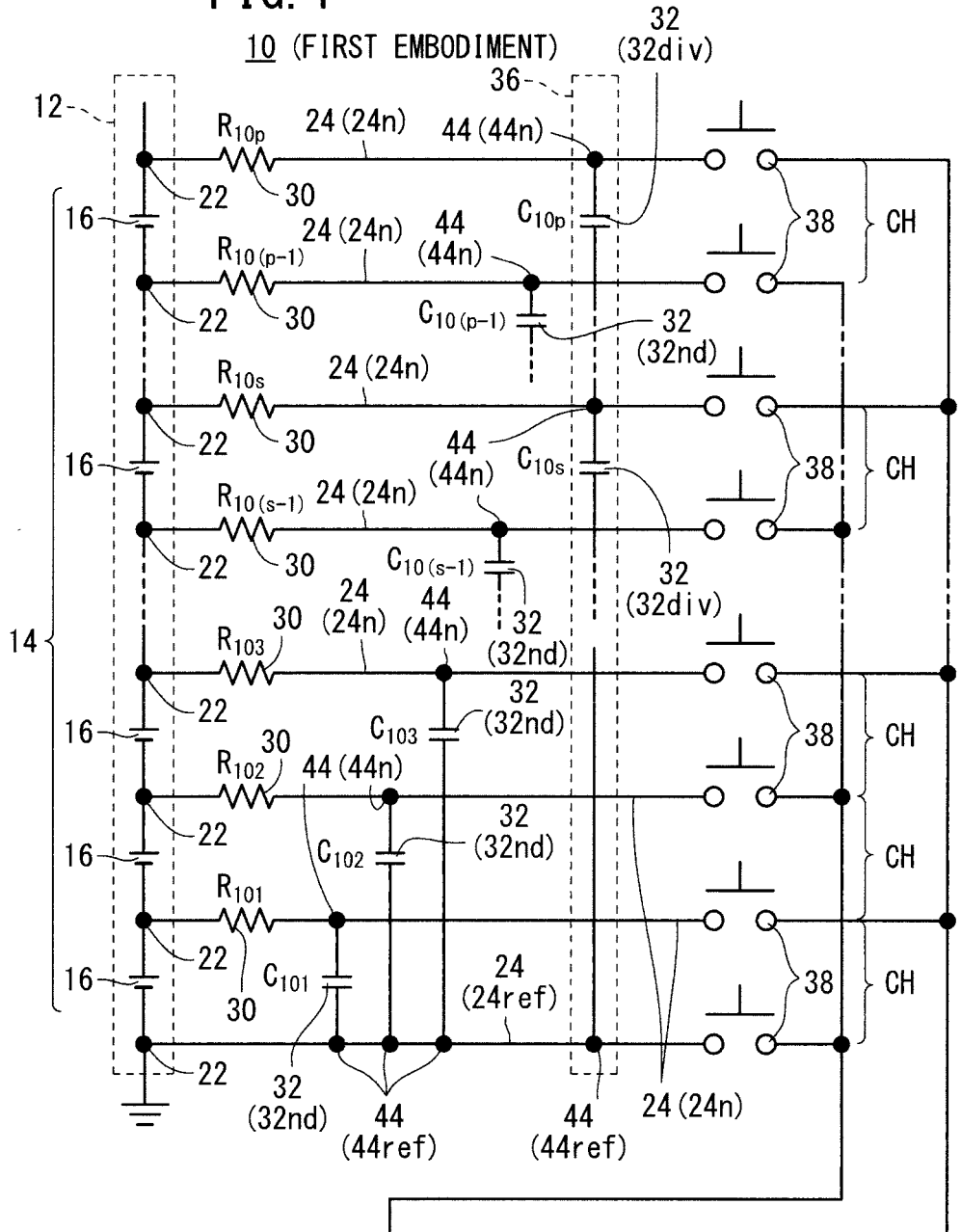
FIG. 1 is a circuit diagram showing an overall arrangement of a voltage measuring device according to a first embodiment of the present invention.

FIG. 1 is a circuit diagram showing an overall arrangement of a voltage measuring device 10 according to a first embodiment of the present invention. The voltage measuring device 10 has an arrangement in which two RC filters are combined. As shown in FIG. 1, the voltage measuring device 10 includes a battery assembly 12 having a module array 14 made up of a plurality of series-connected battery modules 16 (hereinafter referred to as "modules 16"), a voltage measuring circuit 18 to which voltages across the modules 16 (hereinafter referred to as "module voltages Vm") are applied, and a processor 20 for detecting module voltages Vm based on an output signal from the voltage measuring circuit 18. The voltage measuring circuit 18 and the processor 20 jointly make up a voltage detecting means.

Each of the modules 16 comprises at least one cell. According to the first embodiment, each of the modules 16 includes one cell.

Nodes (segmentation points) between the modules 16 and nodes at opposite ends of the module array 14 serve as cell nodes 22. Between the cell nodes 22 and a positive input terminal 26 and a negative input terminal 28 of the voltage measuring circuit 18, as many lines 24 as the number of modules 16 (hereinafter referred to as a "module number") plus 1 are provided, thereby connecting positive and negative pole sides of the modules 16 to the positive input terminal 26 or the negative input terminal 28 of the voltage measuring circuit 18.

More specifically, the positive pole side of a certain module 16, for example, the module 16 on the negative-most pole side (lowermost in FIG. 1) of the module array 14 (hereinafter referred to as a "lowermost module 16"), is connected to the positive input terminal 26 of the voltage measuring circuit 18, whereas the negative pole side of the lowermost module 16 is connected to the negative input terminal 28 of the voltage measuring circuit 18. The positive pole side of a module 16 adjacent to the lowermost module 16 (i.e., a module 16 at a next level up from the lowermost module 16) is connected to the negative input terminal 28 of the voltage measuring circuit 18, whereas the negative pole side of the same module 16 is connected to the positive input terminal 26 of the voltage measuring circuit 18.

Among all of the lines 24, the lines 24 (hereinafter referred to as "non-reference lines 24$n$") except for one line 24 (hereinafter referred to as a "reference line 24ref") include respective resistors 30. There are as many capacitors 32 as the number of modules 16, and the capacitors 32 are paired with respective resistors 30 to make up RC filters. The capacitors 32 include capacitors 32 (hereinafter referred to as "non-dividing capacitors 32$nd$" or "first capacitors 32nd"), which are not connected in series to other capacitors 32, and capacitors 32 (hereinafter referred to as "dividing capacitors 32div" or "second capacitors 23div"), which are connected in series to the other capacitors 32. The combination of the series-connected dividing capacitors 32div will be referred to as a "dividing capacitor group 36" or a "series-connected capacitor group 36".

Respective ends of the non-dividing capacitors 32nd are connected to positive pole sides of the respective modules 16 by the non-reference lines 24n, and respective other ends thereof are connected to the reference line 24ref, which is free of a resistor 30. To each of the non-dividing capacitors 32nd, there is applied the sum of the module voltages VM of the modules 16 up to the module 16 to which one end of the non-dividing capacitor 32nd is connected.

For example, one end of the second lowermost capacitor 32 (electrostatic capacitance $C_{102}$) in FIG. 1 is connected to the positive pole side of the second lowermost module 16 in FIG. 1. Therefore, the voltage applied across the capacitor 32 (electrostatic capacitance $C_{102}$) is represented by the sum $(V_1+V_2)$ of the module voltages Vm of the lowermost and second lowermost modules 16. Similarly, one end of the third lowermost capacitor 32 (electrostatic capacitance $C_{103}$) in FIG. 1 is connected to the positive pole side of the third lowermost module 16 in FIG. 1. Therefore, the voltage applied across the capacitor 32 (electrostatic capacitance $C_{103}$) is represented by the sum $(V_1+V_2+V_3)$ of the module voltages Vm of the lowermost through third lowermost modules 16.

Respective ends of the dividing capacitors 32div (positive pole side ends in FIG. 1) are connected to positive pole sides of the respective modules 16 by the non-reference lines 24n. Among the dividing capacitors 32div, the dividing capacitor 32div that is closest to the reference line 24ref (the capacitor 32 having an electrostatic capacitance $C_{10s}$ in FIG. 1) has another end (negative pole side end in FIG. 1), which is connected to the reference line 24ref. Among the dividing capacitors 32div, the dividing capacitor 32div other than the dividing capacitor 32div that is closest to the reference line 24ref (the capacitor 32 having an electrostatic capacitance $C_{10p}$ in FIG. 1) has another end, which is connected on the non-reference line 24n to the end of the other dividing capacitor 32div (the capacitor 32 having the electrostatic capacitance $C_{10s}$) belonging to the same dividing capacitor group 36.

The sum of the module voltages Vm of the modules 16 up to the module 16 to which one end of the dividing capacitor 32div is connected is not applied to each of the dividing capacitors 32div. Rather, a portion of the sum of such module voltages Vm is applied thereto. Stated otherwise, the voltage applied across each of the dividing capacitors 32div is represented by a voltage that is divided by the other dividing capacitor 32div.

The lines 24 include respective switches 38, which are positioned closer to the voltage measuring circuit 18 than the capacitors 32 (the non-dividing capacitors 32nd and the dividing capacitors 32div). Each of the switches 38 comprises a semiconductor switch, for example, which is turned on and off depending on a control signal supplied thereto from a control circuit 40.

The control circuit 40 turns the switches 38 on and off in sequence, so as to connect the modules 16 sequentially to the voltage measuring circuit 18. For example, for connecting the lowermost module 16 and the voltage measuring circuit 18, the control circuit 40 turns on the two switches 38 on the two lines 24 that interconnect the lowermost module 16 and the voltage measuring circuit 18, and turns off the other switches 38. When turned on, the switches 38 provide measurement channels CH (voltage detecting sections) interconnecting the modules 16 and the voltage measuring circuit 18, whereupon the voltage measuring circuit 18 generates output signals representing module voltages Vm of the respective modules 16. There are as many measurement channels CH as the number of modules 16 (module number).

The battery assembly 12 according to the present embodiment may be either a primary battery or a secondary battery. A suitable primary battery includes a fuel battery, and a suitable secondary battery includes a lithium ion battery, a nickel hydrogen battery, and a capacitor.

The voltage measuring device 10 can measure the module voltages Vm according to the process disclosed in JP2005-003618A, for example.

For illustrative purposes, the resistance value of each of the resistors 30 is denoted by $R_{10x}$ in FIG. 1, where the subscript "x" represents an integer in a range from 1 to p, and which indicates the location counted from the reference line 24ref. For example, the resistance value of the resistor 30 on the first non-reference line 24n from the reference line 24ref is denoted by $R_{101}$. In this case, "p" is equal to the module number. Therefore, the total number of modules 16 (module number) and the total number of resistors 30 are represented by p.

Similarly, for illustrative purposes, the electrostatic capacitance of each of the capacitors 32 is denoted by $C_{10x}$ in FIG. 1, where the subscript "x" indicates the location counted from the reference line 24ref, as described above. For example, the electrostatic capacitance of the first capacitor 32 from the reference line 24ref is denoted by $C_{101}$, and the electrostatic capacitance of the second capacitor 32 from the reference line 24ref is denoted by $C_{102}$. The total number of capacitors 32 is the same as the module number p.

Nodes on opposite ends of each of the capacitors 32 are referred to as "measurement nodes 44". The measurement nodes 44 are nodes (segmentation points) connected to the voltage measuring circuit 18. Two adjacent measurement nodes 44 jointly form a measurement channel CH corresponding to a single module 16 and which is connected to the voltage measuring circuit 18. Measurement nodes 44 that are positioned on the reference line 24ref are referred to as reference nodes 44ref, whereas measurement nodes 44 that are positioned on the non-reference lines 24n are referred to as non-reference nodes 44n. The term "s" represents any integer that satisfies the inequality $3 \leq s-1 \leq s \leq p-1 < p$.

A-2. Basic Concept of Resistance Value $R_{10n}$ and Electrostatic Capacitance $C_{10n}$ A-2-1. General Principles A process of establishing the resistance value $R_{10n}$ of a resistor 30 and the electrostatic capacitance $C_{10n}$ of a capacitor 32 will be described below. According to the first embodiment in which two RC filters are combined, the resistance value $R_{10n}$ and the electrostatic capacitance $C_{10n}$ are established in the following manner.

With respect to the non-dividing capacitors 32nd, the resistance value $R_{10n}$ and the electrostatic capacitance $C_{10n}$ thereof are established such that the time constant of each RC filter will be of a characteristic value τ. Stated otherwise, the resistance value $R_{10n}$ and the electrostatic capacitance $C_{10n}$ can be set to any values, insofar as the product of the resistance value $R_{10n}$ and the electrostatic capacitance $C_{10n}$ is represented by $\tau$.

With respect to the dividing capacitors 32div, the following definitions are given initially.

n: the number of dividing capacitors 32div q: an integer in a range from 1 to n $k_q$: the number of dividing capacitors 32div from the reference line 24ref to a dividing capacitor 32div in question (including a dividing capacitor 32div in question)

$L_{kq}$: the number of non-reference lines 24n from the reference line 24ref to a non-reference line 24n that is connected to the terminal of the $k_q$th dividing capacitor 32div remote from the reference line 24ref (the positive pole side terminal of the dividing capacitor 32div in FIG. 1)

$C_{kq}$: the electrostatic capacitance of the $k_q$th dividing capacitor 32div $R_{kq}$: the resistance value of the resistor 30 that is connected to the $k_q$th dividing capacitor 32div In FIG. 1, $k_1$ corresponds to the capacitor 32 having an electrostatic capacitance $C_{10s}$, and $k_2$ corresponds to the capacitor 32 having an electrostatic capacitance C. The number $L_{k1}$ corresponding to the capacitor 32 having the electrostatic capacitance $C_{10s}$ is represented by "s", and the number $L_{k2}$ corresponding to the capacitor 32 having the electrostatic capacitance $C_{10p}$ is represented by "p".

According to the above definitions, the electrostatic capacitance $C_{kq}$ of each of the dividing capacitors 32div is established to satisfy an inequality (1-1) below, and the resistance $R_{kq}$ of each of the resistors 30 is established to satisfy equations (1-2) and (1-3) below.

$$C_{k1} > C_{k2} \cdot \frac{(L_{k2} - L_{k1})}{L_{k1}} \quad (1\text{-}1)$$

$$R_{k1} = \frac{\tau}{C_{k1} - \left\{C_{k2} \cdot \frac{(L_{k2} - L_{k1})}{L_{k1}}\right\}} \quad (1\text{-}2)$$

$$R_{k1} = \frac{\tau}{C_{k2} \cdot \left\{\frac{(L_{k2} - L_{k1})}{L_{k1}}\right\}} \quad (1\text{-}3)$$

A-2-2. Specific Example

Figure 2:
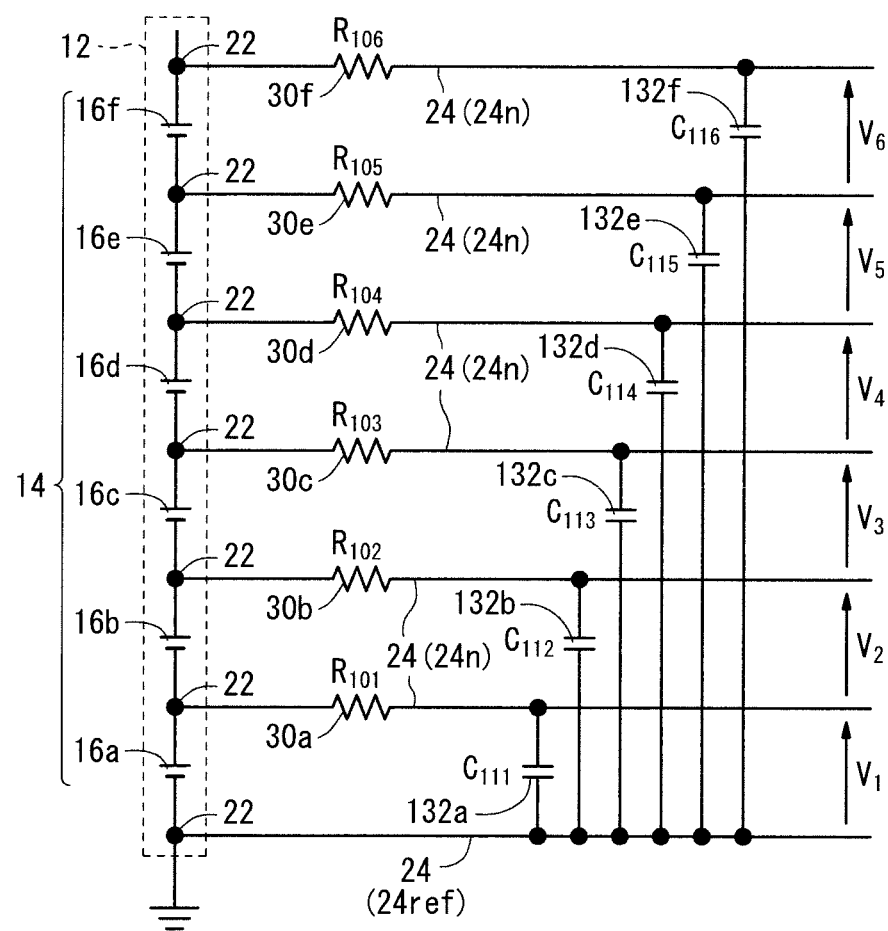
FIG. 2 is a circuit diagram showing a portion of a first voltage measuring device, which is used to illustrate an arrangement of the voltage measuring device according to the first embodiment.
Figure 3:
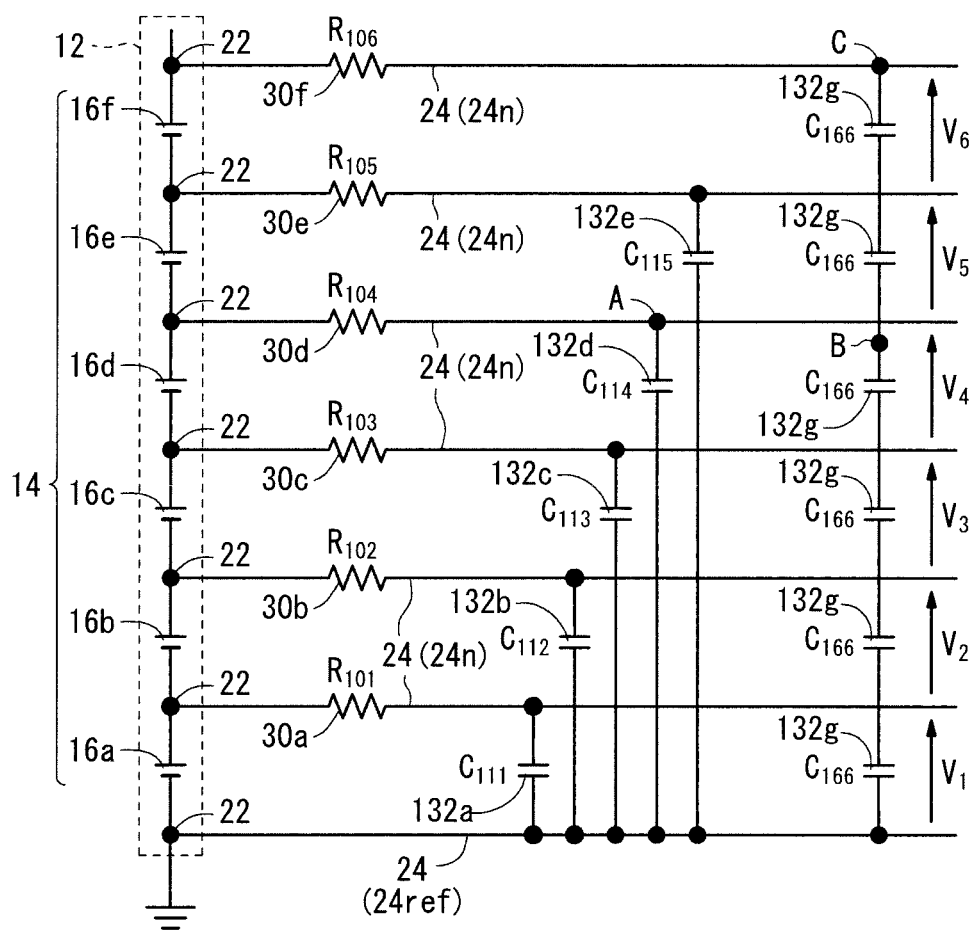
FIG. 3 is a circuit diagram showing a portion of a second voltage measuring device, which is used to illustrate an arrangement of the voltage measuring device according to the first embodiment.
Figure 4:
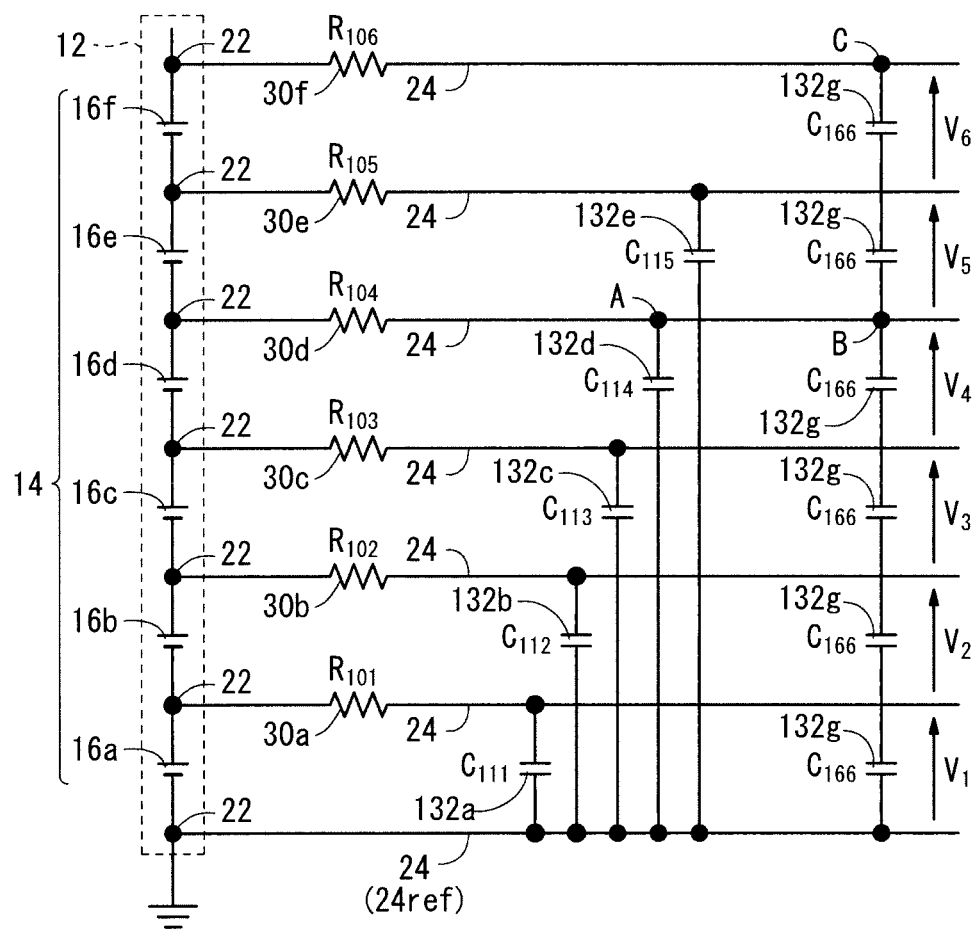
FIG. 4 is a circuit diagram showing a portion of a third voltage measuring device, which is used to illustrate an arrangement of the voltage measuring device according to the first embodiment.

A process for introducing the above inequality and equations (1-1) through (1-3) will be described below by way of a specific example. FIGS. 2 through 4 are circuit diagrams showing portions of first through third voltage measuring devices 100A through 100C (hereinafter referred to as "voltage measuring devices 100A through 100C"), which are used to illustrate arrangements of the voltage measuring device 10 according to the first embodiment. Components thereof, which are identical to the components shown in FIG. 1, are denoted by identical reference characters.

Figure 5:
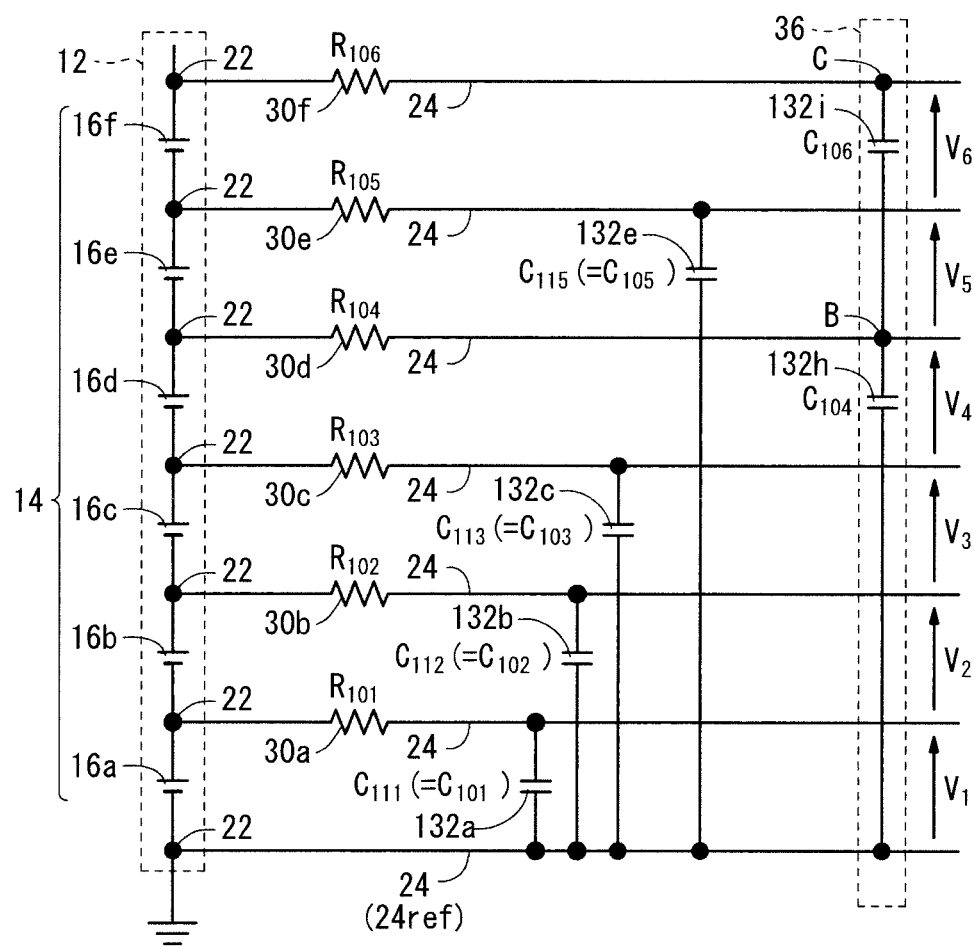
FIG. 5 is a circuit diagram showing a portion of an example of the voltage measuring device according to the first embodiment.

It should be noted that FIGS. 2 through 4 serve to illustrate arrangements of the voltage measuring device 10 according to the above-described first embodiment, i.e., to introduce the arrangement thereof shown in FIG. 5, but do not show the arrangement of the voltage measuring device 10 itself. In other words, an exemplary arrangement of the voltage measuring device 10 is shown in FIG. 5.

The voltage measuring devices 10 and 100A through 100C all include the voltage measuring circuit 18, the processor 20, the switches 38, and the controller 40, etc., as in the case of FIG. 1, although these components are omitted from illustration in FIGS. 2 through 5.

The voltage measuring device 100A shown in FIG. 2 includes a battery assembly 12 having a module array 14, which is made up of a plurality of (six) series-connected battery modules 16a through 16f (hereinafter referred to as "modules 16a through 16f" and collectively referred to as "modules 16"), as many resistors 30a through 30f (hereinafter collectively referred to as "resistors 30") as the number of modules 16, and as many capacitors 132a through 132f as the number of modules 16. The capacitors 132a through 132f are not connected in series, but have respective ends (positive pole sides) thereof, which are connected by non-reference lines 24n to positive pole sides of the respective modules 16, and respective other ends (negative pole sides) thereof, which are connected to a reference line 24ref that is free of a resistor 30. The capacitors 132a through 132f shown in FIG. 2 correspond to the non-dividing capacitors (first capacitors). Therefore, RC filters made up of the resistors 30 and the capacitors 132a through 132f operate independently of each other.

The resistors 30 have respective resistance values $R_{10x}$ denoted by $R_{101}$ through $R_{106}$ counted from the reference line 24ref (upwardly in FIG. 2). The capacitors 132a through 132f have respective electrostatic capacitances $C_{11x}$ denoted by $C_{111}$ through $C_{116}$.

In FIG. 2, it is assumed that the RC products ($R_{10x} \cdot C_{11x}$) (where x represents an integer in a range from 1 through 6) of the RC filters are equal to each other, and that the voltages across respective modules 16 (module voltages Vm) are uniform. In this case, the RC filters have respective uniform output voltages $V_1$, $V_2$, $V_3$, $V_4$, $V_5$, and $V_6$.

As shown in FIG. 3, the capacitor 132f shown in FIG. 2 can be replaced with six series-connected capacitors 132g having an electrostatic capacitance $C_{166}$, which is six times the electrostatic capacitance $C_{116}$ ($C_{166}=C_{116}\times 6$). Since the voltage across the capacitors 132g is divided into six equal voltages, as shown in FIG. 3, the voltage at point B is equal to the voltage at point A.

Therefore, even if one of the midpoints (point B) between the capacitors 132g (intermediate points between adjacent ones of the capacitors 132g) is connected to a corresponding line 24, as shown in FIG. 4, the output voltages $V_1$ through $V_6$ of the RC filters remain the same as those shown in FIG. 2.

Furthermore, as shown in FIG. 5, the group of parallel-connected capacitors shown in FIG. 4 may be replaced with a single capacitor. More specifically, as shown in FIG. 5, the single capacitor 132d and the four capacitors 132g, which are connected between the positive pole side of the module 16d (points A and B shown in FIG. 4) and the line 24 connected to ground, are replaced with a single capacitor 132h. Even if such a replacement is made, the output voltages $V_1$ through $V_6$ of the RC filters remain the same as those shown in FIG. 2.

Assuming that the capacitors 132d, 132g, 132h have respective electrostatic capacitances $C_{114}$, $C_{166}$, $C_{104}$, then the electrostatic capacitance $C_{104}$ is determined by the following equation (2-1), due to the relationships shown in FIGS. 2 through 5.

$$C_{104} = C_{114} + \frac{C_{166}}{4} = C_{114} + \frac{6 \cdot C_{116}}{4} \quad (2\text{-}1)$$

If the time constant of each of the RC filters is represented by a particular constant τ, then the relationship according to the following equation (2-2) is satisfied.

$$C_{104} = \frac{\tau}{R_{104}} + \frac{6}{4} \cdot \frac{\tau}{R_{106}} \quad (2\text{-}2)$$

As shown in FIG. 5, the two capacitors 132g between the lines 24 that are connected to the negative pole side (point B) of the module 16e and the positive pole side (point C) of the module 16f shown in FIG. 4 are replaced with a single capacitor 132i. Assuming that the capacitors 132f, 132g, 132i have respective electrostatic capacitances $C_{116}$, $C_{166}$, $C_{106}$, then the electrostatic capacitance $C_{106}$ is determined by the following equation (2-3), due to the relationships shown in FIGS. 2 through 5.

$$C_{106} = \frac{C_{166}}{6-4} = \frac{6 \cdot C_{116}}{6-4} \quad (2\text{-}3)$$

If the time constant of each of the RC filters is represented by a particular constant τ, then the relationship according to the following equation (2-4) is satisfied.

$$C_{106} = \frac{6}{6-4} \cdot \frac{\tau}{R_{106}} \quad (2\text{-}4)$$

Based on equation (2-4), the resistance value $R_{106}$ of the resistor 30f can be established according to the following equation (2-5).

$$R_{106} = \frac{\tau}{\left(\frac{6-4}{6}\right) \cdot C_{106}} \quad (2\text{-}5)$$

The following equation (2-6) can be derived from equation (2-2) and equation (2-5).

$$C_{104} = \frac{\tau}{R_{104}} + \frac{6}{4} \cdot \frac{6-4}{6} \cdot C_{106} \quad (2\text{-}6)$$

Consequently, based on equation (2-6), the resistance value $R_{104}$ of the resistor 30d can be established according to the following equation (2-7).

$$R_{104} = \frac{\tau}{C_{104} - \frac{6-4}{4} \cdot C_{106}} \quad (2\text{-}7)$$

According to the above-described process, it is possible to establish the electrostatic capacitances $C_{104}$, $C_{106}$ of the dividing capacitors 132h, 132i and the resistance values $R_{104}$, $R_{106}$ of the resistors 30d, 30f.

A-3. Specific Inventive Example and First and Second Comparative Examples

Figure 6:
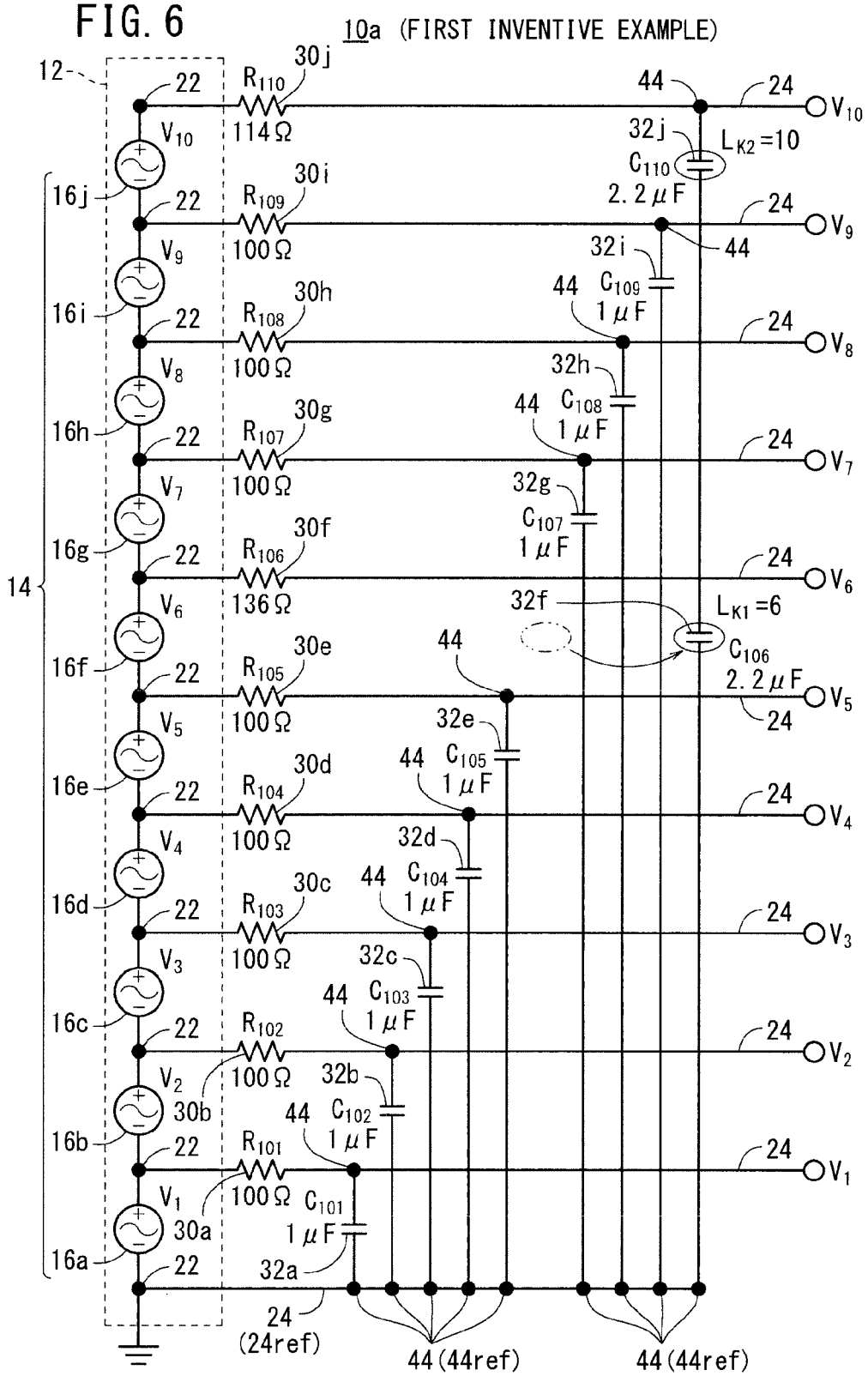
FIG. 6 is a diagram showing a specific example (first inventive example) of numerical values of resistors and capacitors in the arrangement of the voltage measuring device shown in FIG. 1.
Figure 7:
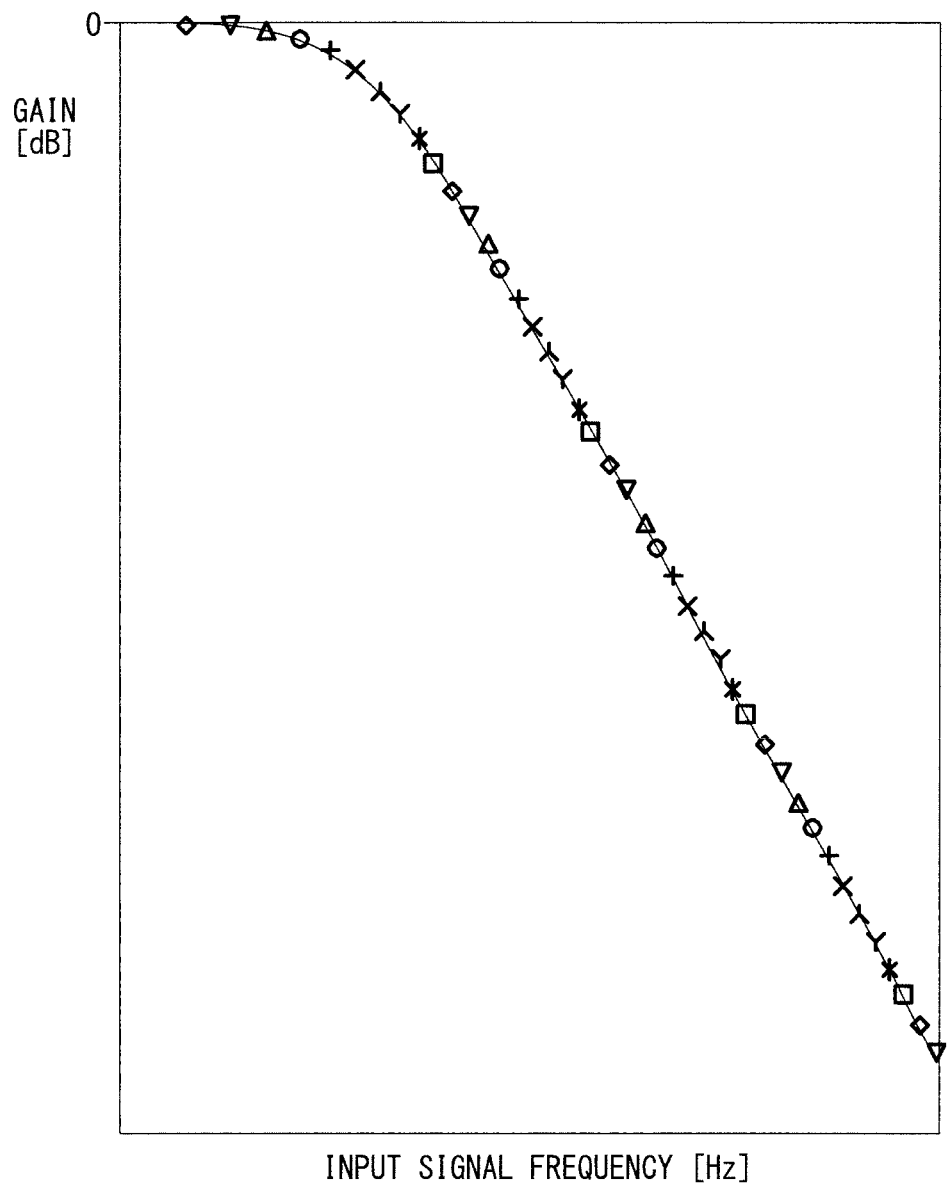
FIG. 7 is a diagram showing by way of example frequency characteristics of RC filters, which were plotted during use of the voltage measuring device shown in FIG. 6.

FIG. 6 is a diagram showing a specific example (first inventive example) of numerical values for the resistors 30 (30a through 30j) and the capacitors 32 (32a through 32j) in the arrangement of the voltage measuring device 10 shown in FIG. 1. FIG. 7 is a diagram showing by way of example frequency characteristics of the RC filters, which were plotted during use of the voltage measuring device shown in FIG. 6. In FIG. 7, the vertical axis represents the frequency [Hz] (logarithmic notation) of an input signal supplied to the RC filters, whereas the horizontal axis represents the gain [dB].

Figure 8:
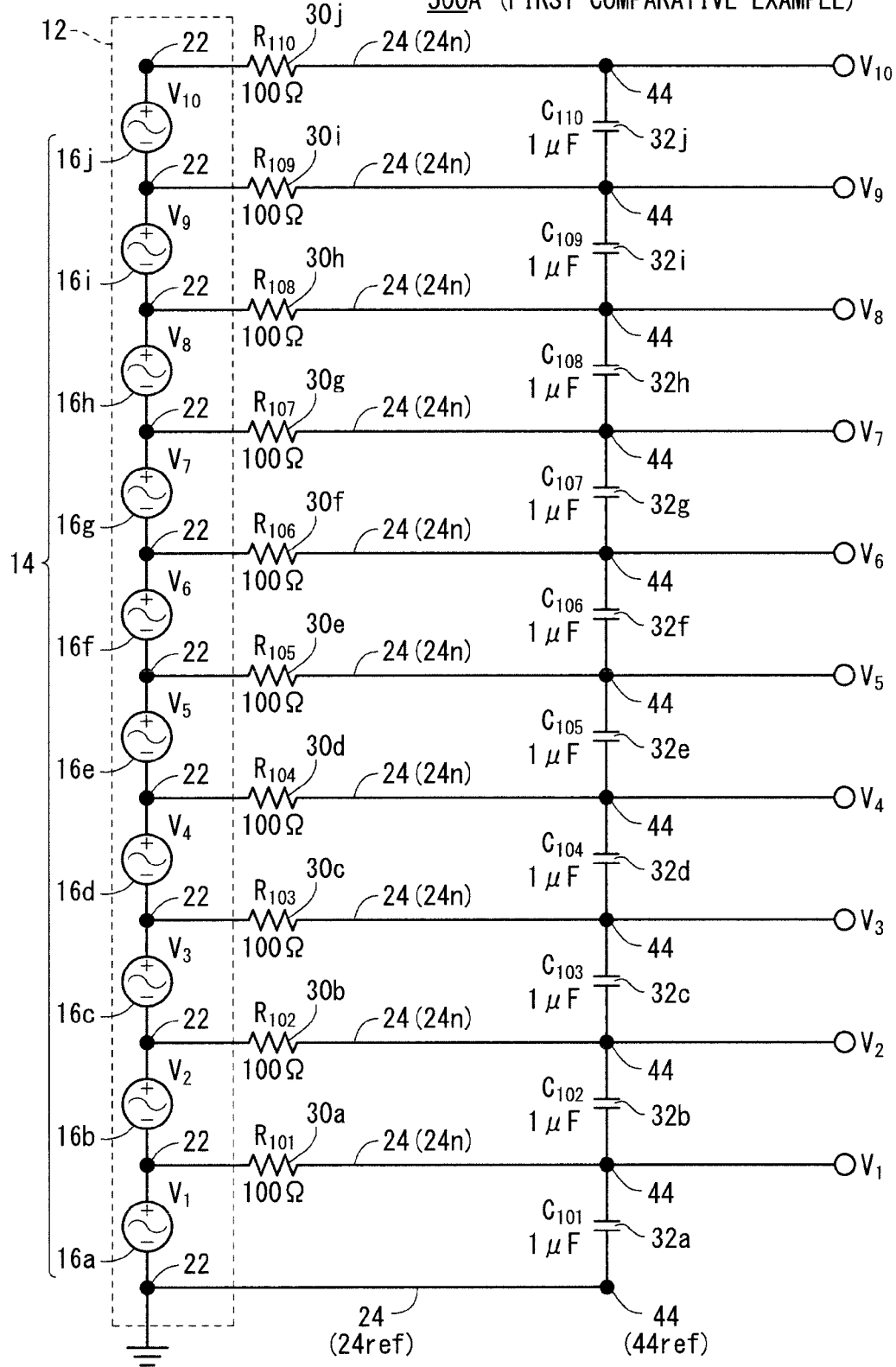
FIG. 8 is a diagram showing a specific example of numerical values of resistors and capacitors in the arrangement of a voltage measuring device according to a first comparative example.
Figure 9:
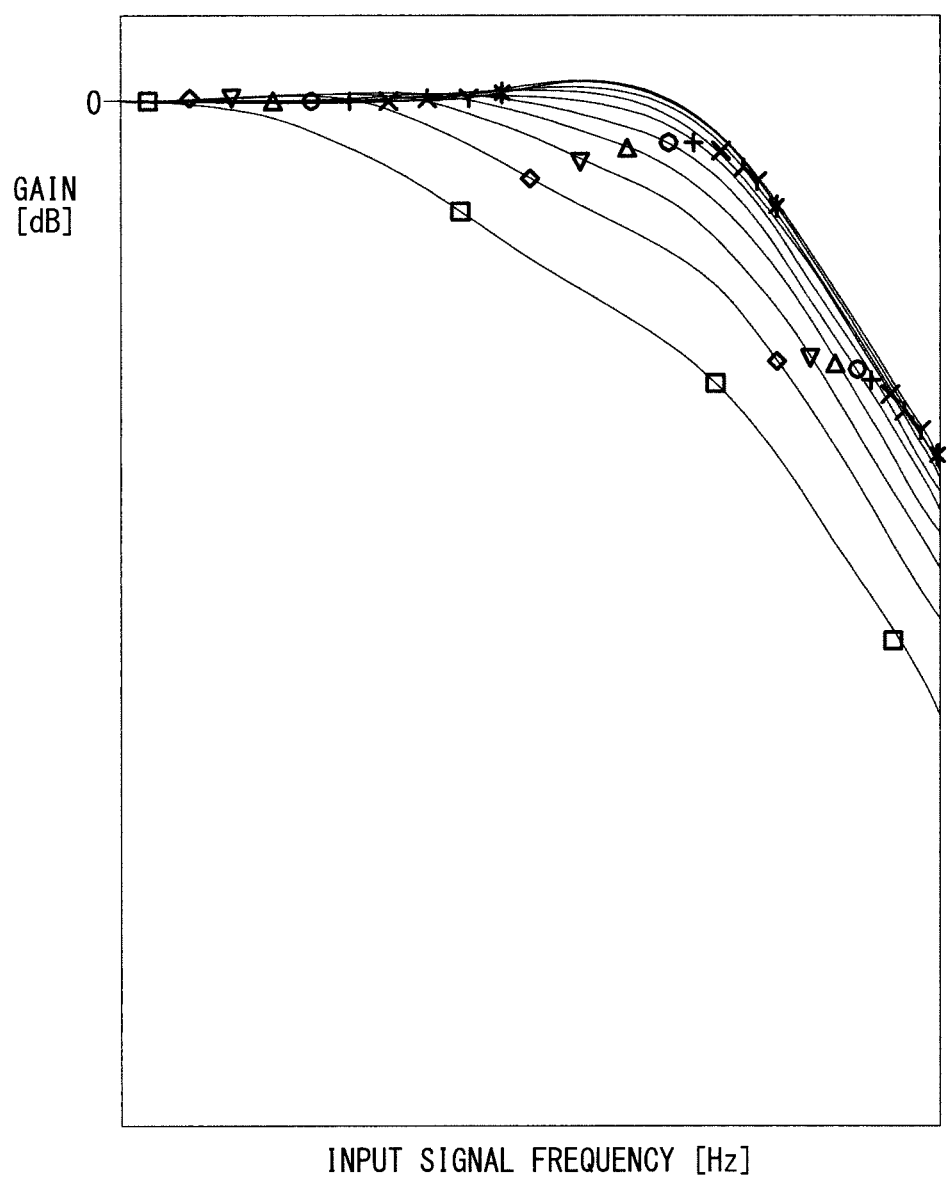
FIG. 9 is a diagram showing by way of example frequency characteristics of RC filters, which were plotted during use of the voltage measuring device shown in FIG. 8.
Figure 10:
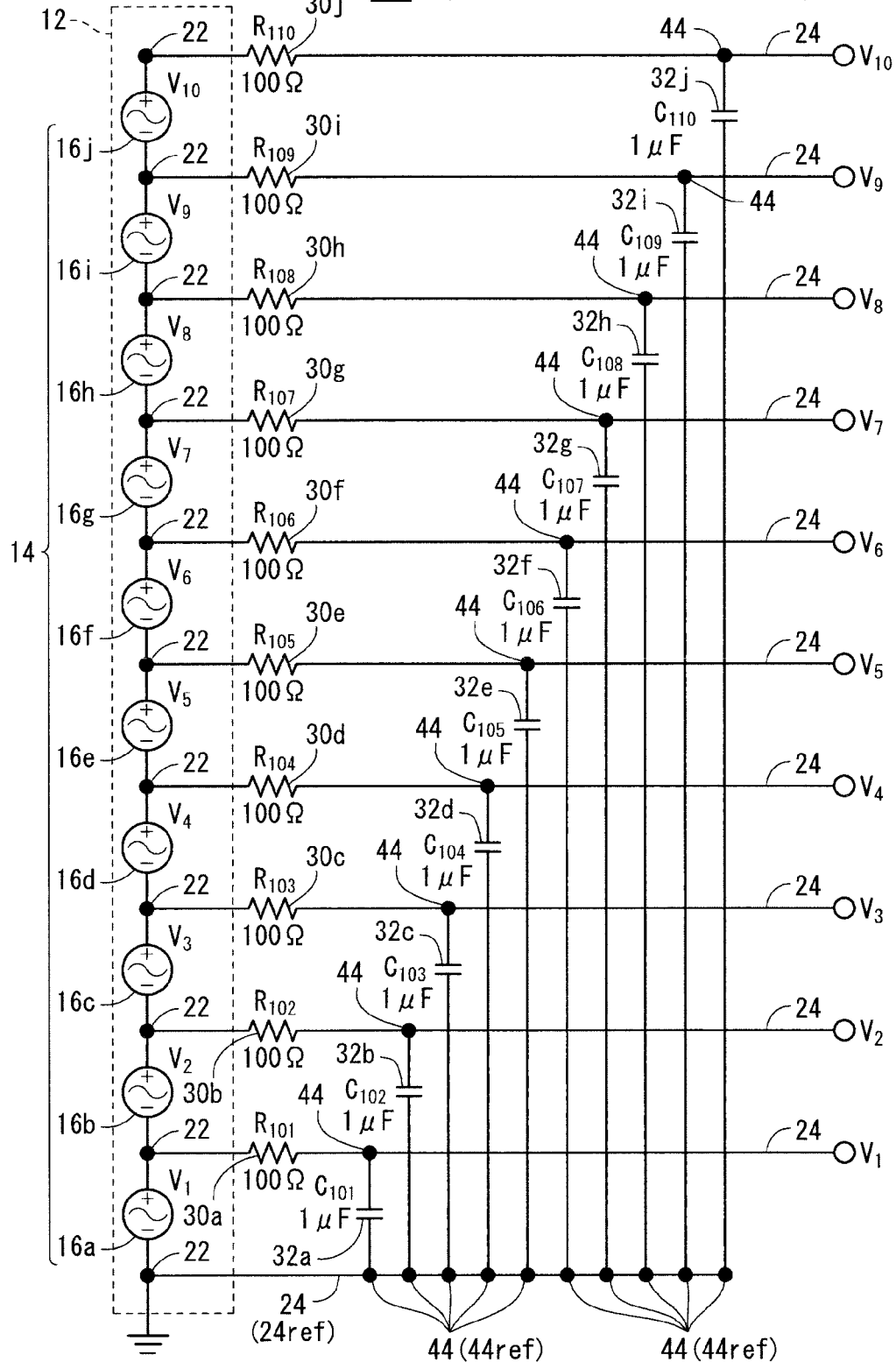
FIG. 10 is a diagram showing a specific example of numerical values of resistors and capacitors in the arrangement of a voltage measuring device according to a second comparative example.
Figure 11:
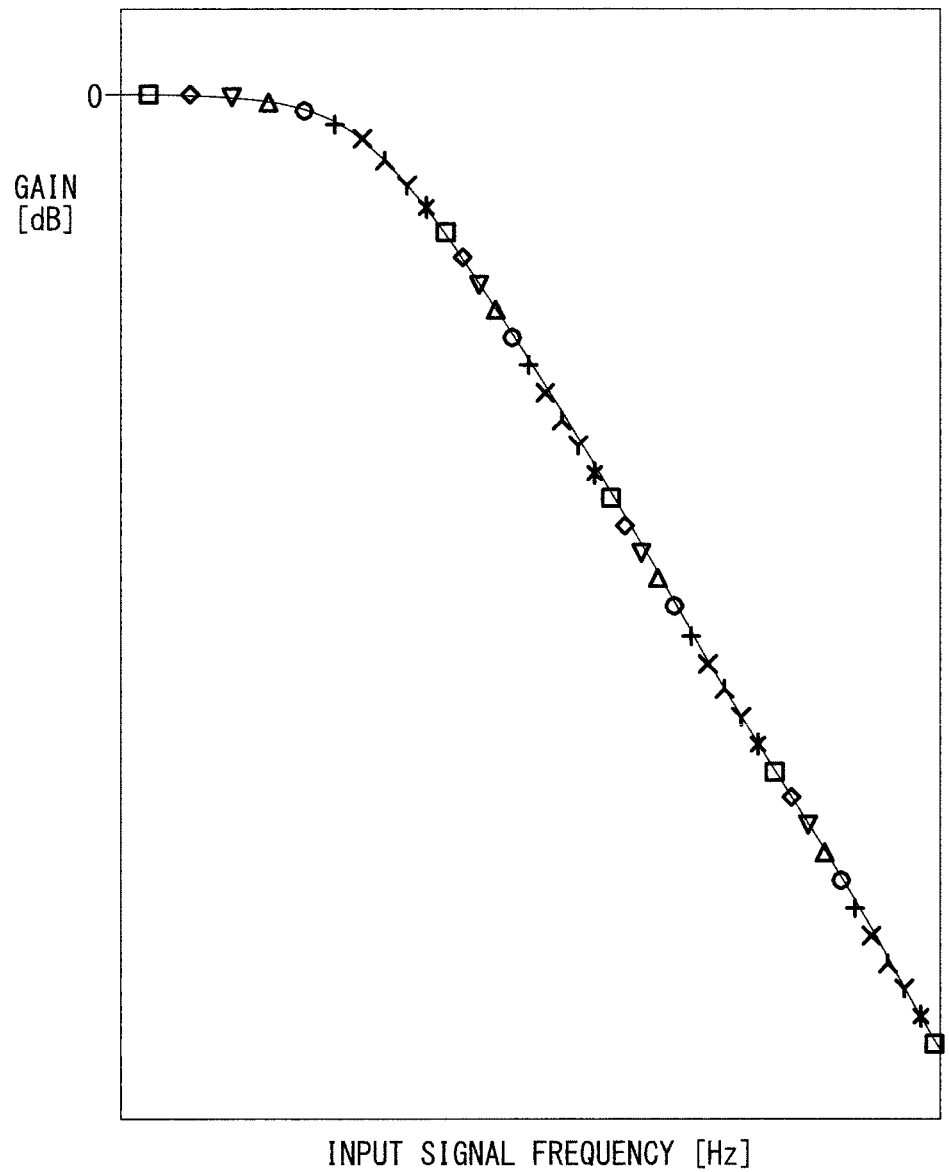
FIG. 11 is a diagram showing by way of example frequency characteristics of RC filters, which were plotted during use of the voltage measuring device shown in FIG. 10.

FIG. 8 is a diagram showing a specific example of numerical values of the resistors 30 (30a through 30j) and the capacitors 32 (32a through 32j) in an arrangement of a voltage measuring device 500A according to a first comparative example. FIG. 9 is a diagram showing by way of example frequency characteristics of RC filters, which were plotted during use of the voltage measuring device 500A shown in FIG. 8. FIG. 10 is a diagram showing a specific example of numerical values of the resistors 30 (30a through 30j) and the capacitors 32 (32a through 32j) in an arrangement of a voltage measuring device 500B according to a second comparative example. FIG. 11 is a diagram showing by way of example frequency characteristics of RC filters, which were plotted during use of the voltage measuring device 500B shown in FIG. 10.

In FIGS. 6, 8, and 10, the battery modules 16 (16a through 16j) are indicated as an AC sign, due to the fact that the battery modules 16 are made up of cells the voltages of which vary as the battery modules 16 are charged and discharged.

The voltage measuring device 500A according to the first comparative example shown in FIG. 8 has all of the capacitors 32 connected in series, unlike the voltage measuring device 10 according to the first embodiment shown in FIG. 6. The resistors 30 have identical resistance values $R_{101}$ through $R_{110}$ each of which is 100Ω, and the capacitors 32 have identical electrostatic capacitances $C_{101}$ through $C_{110}$ each of which is 1 μF.

As shown in FIG. 9, frequency characteristics of the RC filters in the respective stages (measurement channels CH) of the voltage measuring device 500A shown in FIG. 8 differ widely from each other.

In the voltage measuring device 500B according to the second comparative example shown in FIG. 10, all of the capacitors 32 are not connected in series, unlike the voltage measuring device 10 according to the first embodiment shown in FIG. 6. Therefore, the RC filters, which are made up of the resistors 30 and the capacitors 32, operate independently of each other. The resistors 30 have identical resistance values $R_{101}$ through $R_{110}$ each of which is 100Ω, and the capacitors 32 have identical electrostatic capacitances $C_{101}$ through $C_{110}$ each of which is 1 μF.

As shown in FIG. 11, the frequency characteristics of the RC filters in the respective stages (measurement channels CH) of the voltage measuring device 500B shown in FIG. 10 are uniform. However, since the voltages applied to certain capacitors 32 (e.g., the capacitors 32h through 32j), which are positioned closer to the positive pole side of the module array 14 (the upper side in FIG. 10), are higher, it is necessary to increase the withstand voltage limits for the capacitors 32 that are closer to the positive pole side.

As shown in FIG. 6, the voltage measuring device 10 according to the first embodiment has the capacitors 32a through 32e and 32g through 32i, which serve as the non-dividing capacitors 32nd(first capacitors 32nd), and the capacitors 32f, 32j, which serve as the dividing capacitors 32div (second capacitors 32div), used in combination. Consequently, it is possible to increase the degree of freedom with which the RC filters are designed, while at the same time lowering withstand voltage limits for the capacitors 32.

The voltage measuring device 10 shown in FIG. 6 is designed according to the following sequence, for example. First, a required time constant τ is established. According to the first inventive example, the time constant τ=100 μsec.

Thereafter, electrostatic capacitances $C_{10x}$ of the capacitors 32 are determined. According to the first inventive example, the product of the electrostatic capacitances $C_{101}$ through $C_{105}$ and $C_{107}$ through $C_{109}$ of the non-dividing capacitors 32a through 32e and 32g through 32i, and the resistance values $R_{101}$ through $R_{105}$ and $R_{107}$ through $R_{109}$ of the resistors 30a through 30e and 30g through 30i, which are paired with the non-dividing capacitors 32a through 32e and 32g through 32i, is represented by τ. Therefore, the electrostatic capacitances $C_{101}$ through $C_{105}$ and $C_{107}$ through $C_{109}$ of the non-dividing capacitors 32a through 32e and 32g through 32i can be established comparatively freely.

According to the first inventive example, each of the electrostatic capacitances $C_{101}$ through $C_{105}$ and $C_{107}$ through $C_{109}$ of the non-dividing capacitors 32a through 32e and 32g through 32i is established as 1 μF. Accordingly, each of the resistance values $R_{101}$ through $R_{105}$ and $R_{107}$ through $R_{109}$ of the resistors 30a through 30e and 30g through 30i is established as 100Ω.

The electrostatic capacitances $C_{106}$, $C_{110}$ of the dividing capacitors 32f, 32j, which satisfy the above inequality (1-1), are established as 2.2 μF each.

The resistance values $R_{106}$, $R_{110}$ of the resistors 30f, 30j, which are paired with the dividing capacitors 32f, 32j, are established as 136Ω and 114Ω (rounded off to whole numbers), respectively, based on equations (1-2) and (1-3) and the electrostatic capacitance $C_{106}$. In the inequality and equations (1-1), (1-2), and (1-3), the numbers $L_{k1}$ and $L_{k2}$ (i.e., the numbers of the non-reference lines 24n from the reference line 24ref to the non-reference lines 24n that are connected to the respective terminals of the capacitors 32g, 32j, which are located remotely (toward the positive pole side) from the reference line 24ref), are represented by 6 and 10, respectively.

With the arrangement shown in FIG. 6, as shown in FIG. 7, it is possible to realize a certain time constant τ and to make the frequency characteristics of the RC filters uniform.

A-4. Advantages of the First Embodiment

The first embodiment has an arrangement in which two RC filters are combined together, whereas a third embodiment, to be described later, has an arrangement (a more general arrangement) in which the number of combined RC filters is unlimited. Therefore, the advantages of the first embodiment will be described in detail in connection with the third embodiment.

B. Second Embodiment (Arrangement in which Three RC Filters are Combined)

B-1. Overall Arrangement

Figure 12:
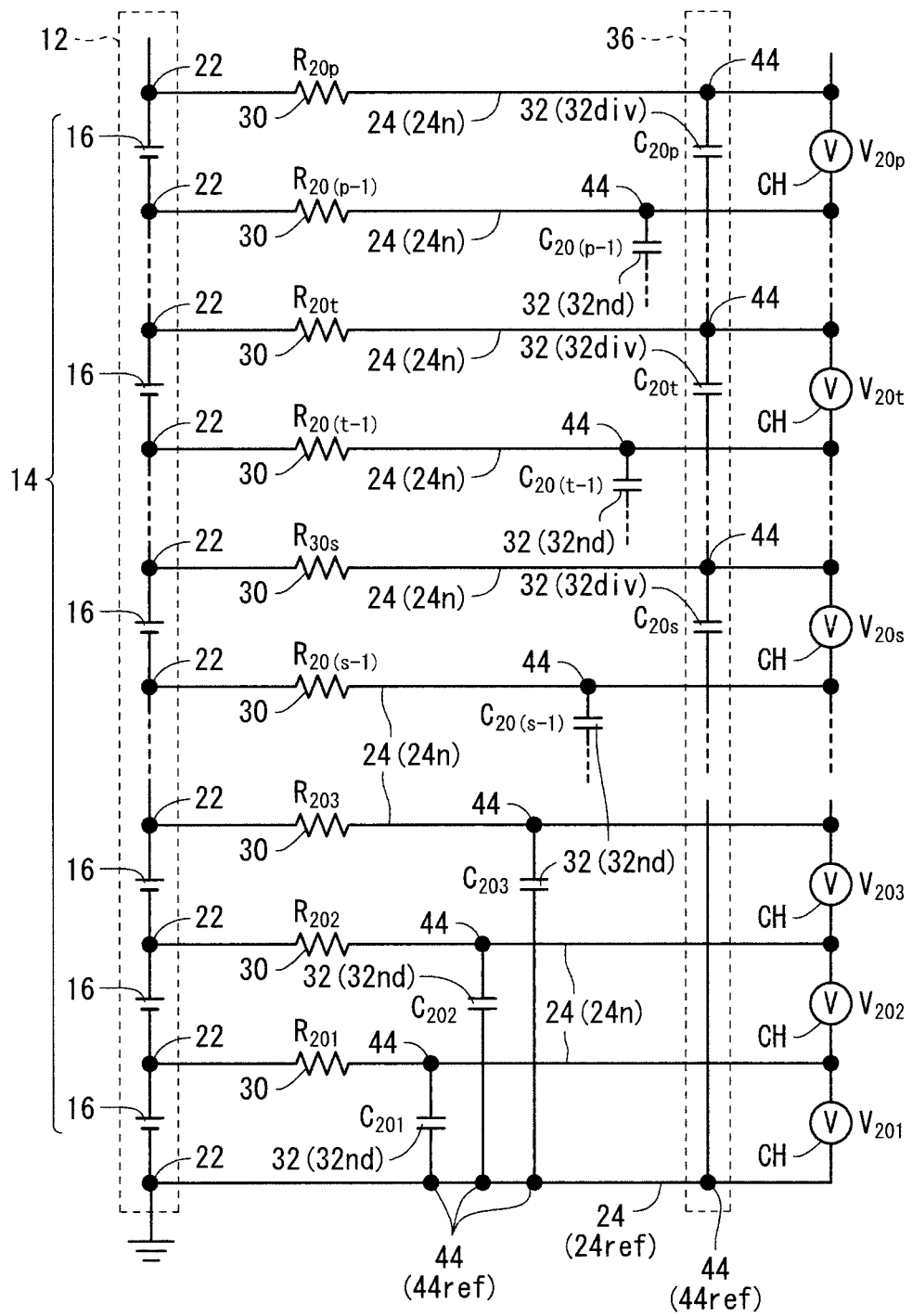
FIG. 12 is a circuit diagram showing a portion of a voltage measuring device according to a second embodiment of the present invention.

FIG. 12 is a circuit diagram showing a portion of a voltage measuring device 10A according to a second embodiment of the present invention. The voltage measuring device 10A according to the second embodiment is basically of the same arrangement as the voltage measuring device 10 according to the first embodiment, but differs therefrom in that, while the voltage measuring device 10 according to the first embodiment has two dividing capacitors 32div combined to provide two RC filters, the voltage measuring device 10A according to the second embodiment has three dividing capacitors 32div combined to provide three RC filters.

The voltage measuring device 10A includes the voltage measuring circuit 18, the processor 20, the switches 38, the controller 40, etc., similar to the case shown in FIG. 1, although such components are omitted from illustration in FIG. 12. In FIG. 12, the terms "s" and "t" represent integers that satisfy the inequality 3<s−1<s<t−1<t<p−1<p.

B-2. Basic Concept of Resistance Value $R_{20x}$ and Electrostatic Capacitance $C_{20x}$ B-2-1. General Principles A process of establishing the resistance value $R_{20x}$ of a resistor 30 and the electrostatic capacitance $C_{20x}$ of a capacitor 32 in the second embodiment will be described below. According to the second embodiment, in which three RC filters are combined, the resistance value $R_{20x}$ and the electrostatic capacitance $C_{20x}$ are established in the following manner.

With respect to a non-dividing capacitor 32nd, the resistance value $R_{20x}$ and the electrostatic capacitance $C_{20x}$ thereof are established such that the time constant of each RC filter will be a characteristic value τ. Stated otherwise, the resistance value $R_{20x}$ and the electrostatic capacitance $C_{20x}$ can be set to any values, insofar as the product of the resistance value $R_{20x}$ and the electrostatic capacitance $C_{20x}$ is represented by τ.

With respect to a dividing capacitor 32div, the following definitions are given initially.

n: the number of dividing capacitors 32div q: an integer in a range from 1 to n $k_q$: the number of dividing capacitors 32div from the reference line 24ref to a dividing capacitor 32div in question (including a dividing capacitor 32div in question)

$L_{kq}$: the number of non-reference lines 24n from the reference line 24ref to a non-reference line 24n that is connected to the terminal of the $k_q$th dividing capacitor 32div remote from the reference line 24ref (the positive pole side terminal of the dividing capacitor 32div shown in FIG. 12)

$C_{kq}$: the electrostatic capacitance of the $k_q$th dividing capacitor 32div $R_{kq}$: the resistance value of the resistor 30 that is connected to the $k_q$th dividing capacitor 32div In FIG. 12, $k_1$ corresponds to a capacitor 32 having an electrostatic capacitance $C_{20s}$, $k_2$ corresponds to a capacitor 32 having an electrostatic capacitance $C_{20t}$, and $k_3$ corresponds to a capacitor 32 having an electrostatic capacitance $C_{20p}$. The number $L_{k1}$ corresponding to the capacitor 32 having the electrostatic capacitance $C_{20s}$ is represented by "s", the number $L_{k2}$ corresponding to the capacitor 32 having the electrostatic capacitance $C_{20t}$ is represented by "t", and the number $L_{k3}$ corresponding to the capacitor 32 having the electrostatic capacitance $C_{20p}$ is represented by "p".

According to the above definitions, the electrostatic capacitance $C_{kq}$ of each of the dividing capacitors 32div is established to satisfy inequalities (3-1) and (3-2) below, and the resistance $R_{kq}$ of each of the resistors 30 is established to satisfy equations (3-3), (3-4), and (3-5) below.

$$C_{k1} > C_{k2} \cdot \frac{(L_{k2} - L_{k1})}{L_{k1}} \qquad (3\text{-}1)$$

$$C_{k2} > C_{k3} \cdot \frac{(L_{k3} - L_{k2})}{(L_{k2} - L_{k1})} \quad (3\text{-}2)$$

$$R_{k1} = \frac{\tau}{C_{k1} - \left\{ C_{k1} \cdot \frac{(L_{k2} - L_{k1})}{L_{k1}} \right\}} \quad (3\text{-}3)$$

$$R_{k2} = \frac{\tau}{C_{k2} \cdot \left\{ \frac{(L_{k2} - L_{k1})}{L_{k2}} \right\} - C_{k3} \cdot \left\{ \frac{(L_{k3} - L_{k2})}{L_{k2}} \right\}} \quad (3\text{-}4)$$

$$R_{k3} = \frac{\tau}{C_{k3} \cdot \left\{ \frac{(L_{k3} - L_{k2})}{L_{k3}} \right\}} \quad (3\text{-}5)$$

B-2-2. Specific Example

Figure 13:
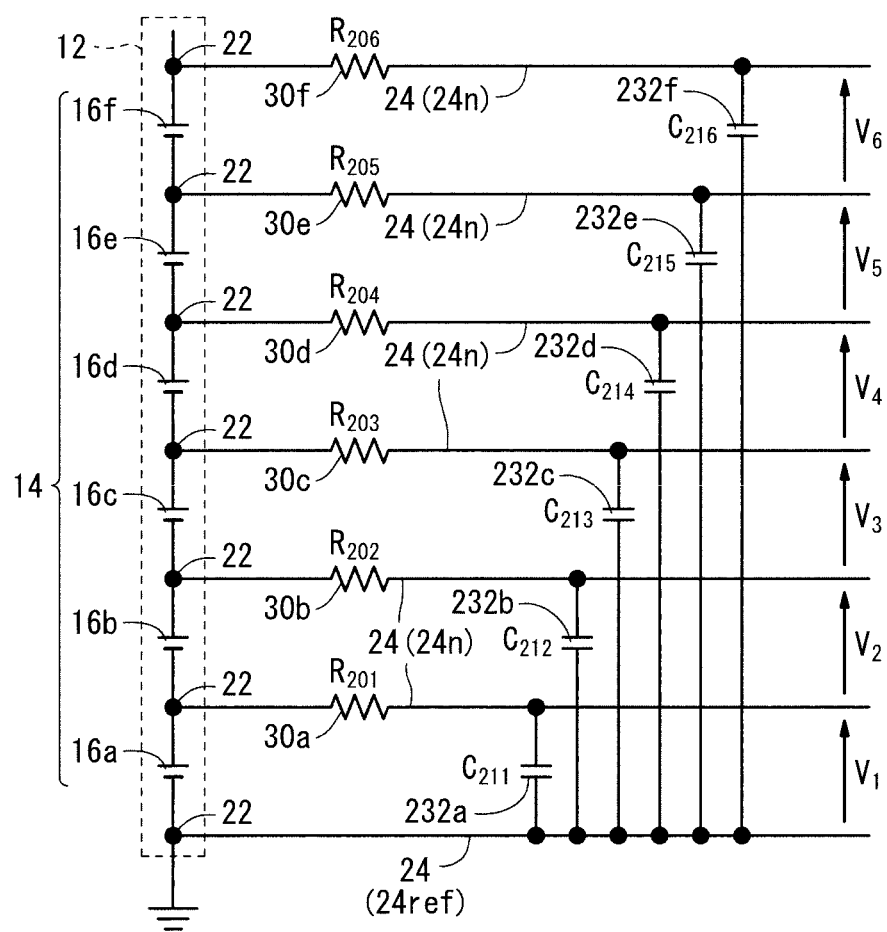
FIG. 13 is a circuit diagram showing a portion of a first voltage measuring device, which is used to illustrate an arrangement of the voltage measuring device according to the second embodiment.
Figure 14:
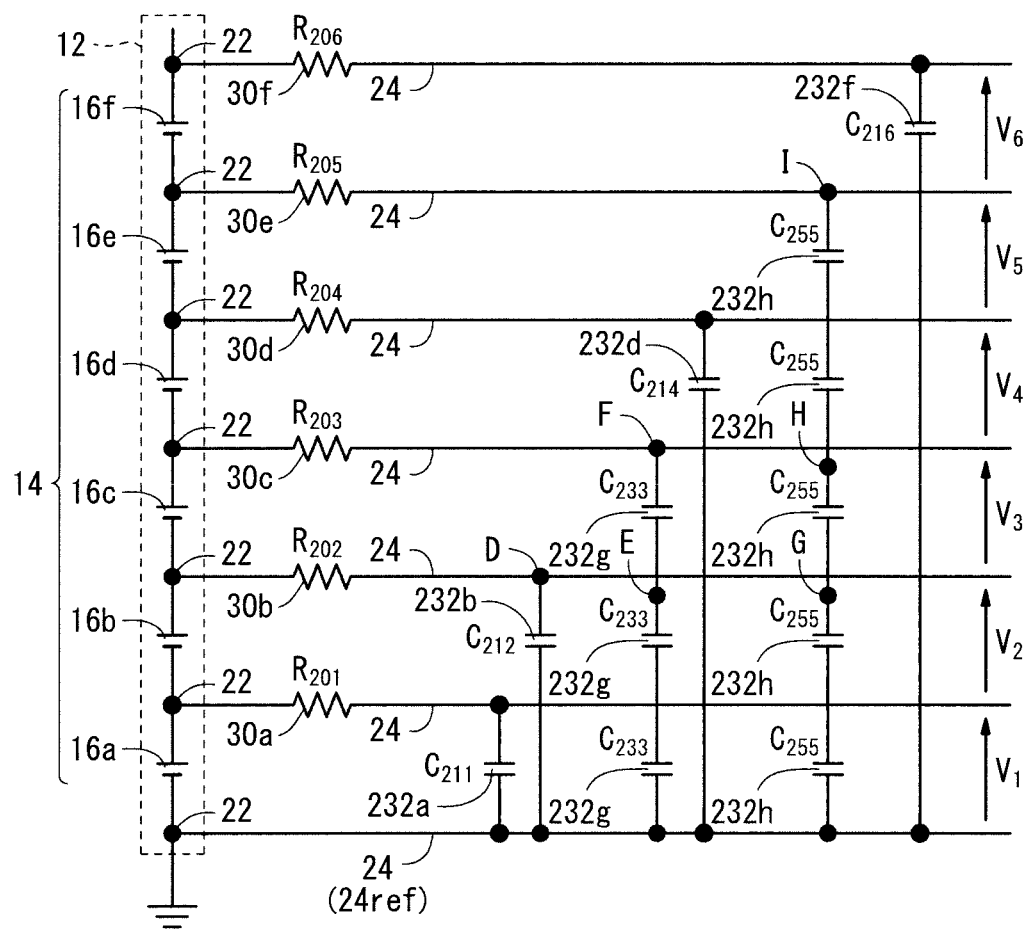
FIG. 14 is a circuit diagram showing a portion of a second voltage measuring device, which is used to illustrate an arrangement of the voltage measuring device according to the second embodiment.
Figure 15:
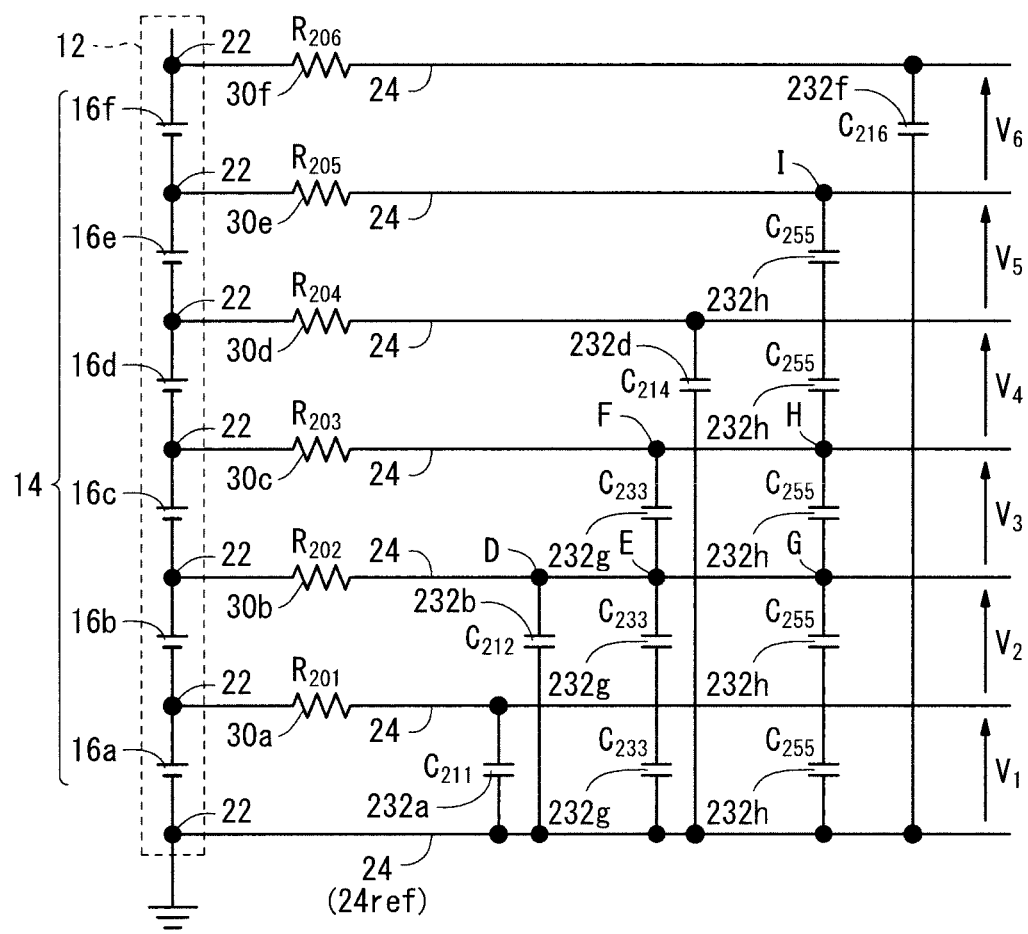
FIG. 15 is a circuit diagram showing a portion of a third voltage measuring device, which is used to illustrate an arrangement of the voltage measuring device according to the second embodiment.
Figure 16:
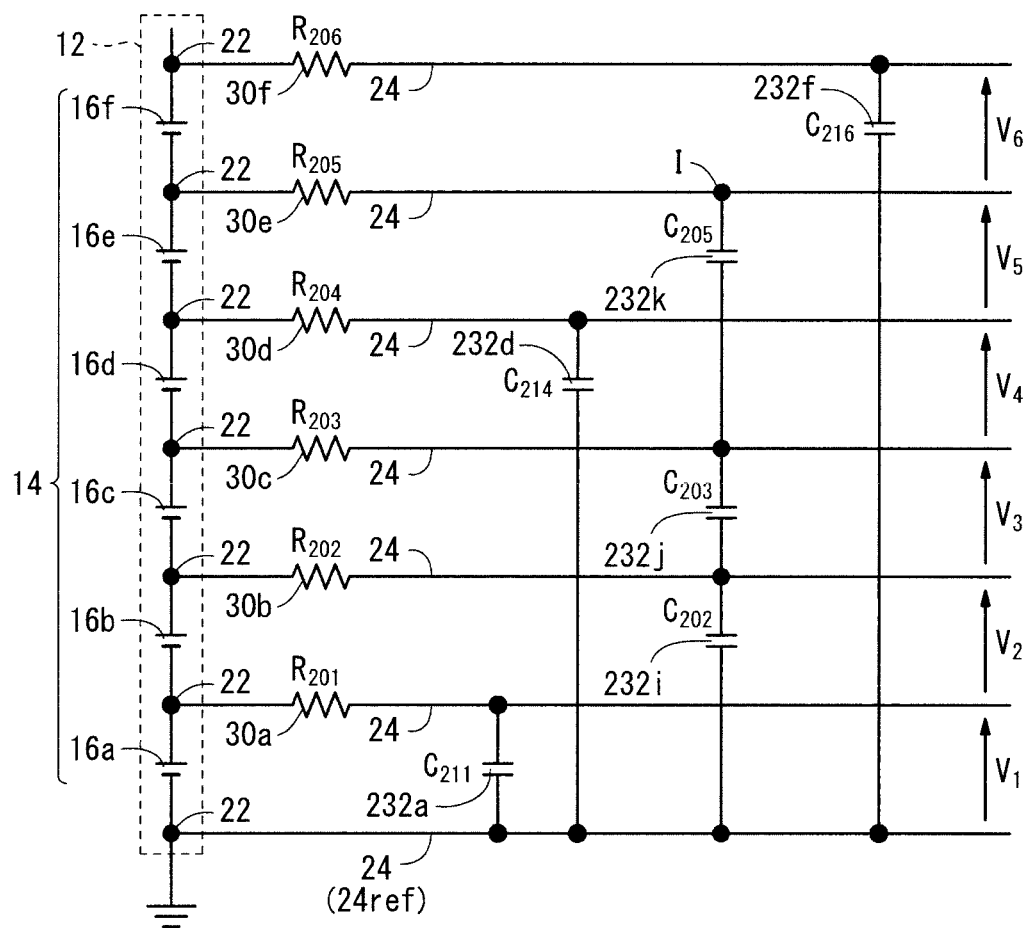
FIG. 16 is a circuit diagram showing a portion of an example of the voltage measuring device according to the second embodiment.

A process for introducing the above inequalities and equations (3-1) through (3-5) will be described below by way of a specific example. FIGS. 13 through 15 are circuit diagrams showing portions of first through third voltage measuring devices 200A through 200C (hereinafter referred to as "voltage measuring devices 200A through 200C"), which are used to illustrate arrangements of the voltage measuring device 10A according to the second embodiment. FIG. 16 is a circuit diagram showing a portion of an example of the voltage measuring device 10A according to the second embodiment. Components thereof, which are identical to the components according to the first embodiment (FIG. 1, etc.) and shown in FIG. 12, are denoted by identical reference characters.

It should be noted that FIGS. 13 through 15 serve to illustrate arrangements of the voltage measuring device 10A according to the above-described second embodiment, i.e., to introduce an arrangement thereof shown in FIG. 16, but do not show the arrangement of the voltage measuring device 10A itself. In other words, FIG. 16 shows an exemplary arrangement of the voltage measuring device 10A.

The voltage measuring devices 10A and 200A through 200C all include the voltage measuring circuit 18, the processor 20, the switches 38, and the controller 40, etc., as in the case of the first embodiment (FIG. 1), although these components are omitted from illustration in FIGS. 13 through 16.

The voltage measuring device 200A shown in FIG. 13 includes a battery assembly 12 having a module array 14, which is made up of a plurality of (six) series-connected battery modules 16 (16a through 16f), as many resistors 30 (30a through 30f) as the number of modules 16, and as many capacitors 232a through 232f as the number of modules 16. The capacitors 232a through 232f are not connected in series, but have respective ends (positive pole sides) thereof, which are connected by non-reference lines 24n to the positive pole sides of the respective modules 16, and respective other ends (negative pole sides) thereof, which are connected to a reference line 24ref that is free of a resistor 30. The capacitors 232a through 232f shown in FIG. 13 correspond to the non-dividing capacitors (first capacitors). Therefore, RC filters made up of the resistors 30 and the capacitors 232a through 232f operate independently of each other.

The resistors 30 have respective resistance values $R_{20x}$ denoted by $R_{201}$ through $R_{206}$ counted from the reference line 24ref (upwardly in FIG. 13). The capacitors 232a through 232f have respective electrostatic capacitances $C_{21x}$ denoted by $C_{211}$ through $C_{216}$.

In FIG. 13, it is assumed that the RC products ($R_{20x} \cdot C_{21x}$) (where x represents an integer in a range from 1 through 6) of the RC filters are equal to each other, and that the voltages across respective modules 16 (module voltages Vm) are uniform. In this case, the RC filters have respective uniform output voltages of $V_1$, $V_2$, $V_3$, $V_4$, $V_5$, and $V_6$.

As shown in FIG. 14, the capacitor 232c shown in FIG. 13 can be replaced with three series-connected capacitors 232g having an electrostatic capacitance $C_{233}$, which is three times the electrostatic capacitance $C_{213}$ ($C_{233} = C_{213} \times 3$). Since the voltage across the capacitors 232g is divided into three equal voltages, as shown in FIG. 14, the voltage at point E is equal to the voltage at point D. Likewise, the capacitor 232e shown in FIG. 13 can be replaced with first series-connected capacitors 232h having an electrostatic capacitance $C_{255}$ that is five times the electrostatic capacitance $C_{215}$ ($C_{255} = C_{215} \times 5$). Since the voltage across the capacitors 232h is divided into five equal voltages, as shown in FIG. 14, the voltage at point G is equal to the voltages at points D and E, and the voltage at point H is equal to the voltage at point F.

Therefore, even if one of the midpoints (point E) between the capacitors 232g (intermediate points between adjacent ones of the capacitors 232g) is connected to a corresponding line 24, and two of the midpoints (point G and point H) between the capacitors 232h (intermediate points between adjacent ones of the capacitors 232h) are connected to a corresponding line 24, as shown in FIG. 15, the output voltages $V_1$ through $V_6$ of the RC filters remain the same as those shown in FIG. 13.

Furthermore, as shown in FIG. 16, a group of parallel-connected capacitors shown in FIG. 15 is replaced with a single capacitor. More specifically, the single capacitor 232b, the two capacitors 232g, and the two capacitors 232h, which are connected between the positive pole side of the module 16b (points D, E, G shown in FIG. 15) and the line 24 connected to ground, are replaced with a single capacitor 232i. The single capacitor 232g and the single capacitor 232h, which are connected between the positive pole side of the module 16c (points F, H) and the line 24 connected to the negative pole side of the module 16c (points E, G), are replaced with a single capacitor 232j. Furthermore, the two capacitors 232h, which are connected between the negative pole side of the module 16d (point H) and the line 24 connected to the positive pole side of the module 16e (point I), are replaced with a single capacitor 232k. Even if such replacements are made, the output voltages $V_1$ through $V_6$ of the RC filters remain the same as those shown in FIG. 13.

Assuming that the capacitors 232b, 232c, 232e, 232g, 232h, 232i, 232j, 232k have respective electrostatic capacitances $C_{212}$, $C_{213}$, $C_{215}$, $C_{233}$, $C_{255}$, $C_{202}$, $C_{203}$, $C_{205}$, then the electrostatic capacitances $C_{202}$, $C_{203}$, $C_{205}$ are determined by the following equations (4-1), (4-2), and (4-3), due to the relationships shown in FIGS. 13 through 16.

$$C_{202} = C_{212} + \frac{C_{233}}{2} + \frac{C_{255}}{2} = C_{212} + \frac{3}{2} \cdot C_{213} + \frac{5}{2} \cdot C_{215} \quad (4\text{-}1)$$

$$C_{203} = \frac{C_{233}}{3-2} + \frac{C_{255}}{3-2} = \frac{3}{3-2} \cdot C_{213} + \frac{5}{3-2} \cdot C_{215} \quad (4\text{-}2)$$

$$C_{205} = \frac{C_{255}}{5-3} = \frac{5}{5-3} \cdot C_{215} \quad (4\text{-}3)$$

If the time constant of each RC filter is represented by a particular constant τ, then the relationships according to the following equations (4-4), (4-5), and (4-6) are satisfied.

$$C_{202} = \frac{\tau}{R_{202}} + \frac{3}{2} \cdot \frac{\tau}{R_{203}} + \frac{5}{2} \cdot \frac{\tau}{R_{205}} \quad (4\text{-}4)$$

$$C_{203} = \frac{3}{3-2} \cdot \frac{\tau}{R_{203}} + \frac{5}{3-2} \cdot \frac{\tau}{R_{205}} \quad (4\text{-}5)$$

$$C_{205} = \frac{5}{5-3} \cdot \frac{\tau}{R_{205}} \quad (4\text{-}6)$$

Based on equation (4-6), the resistance value $R_{205}$ of the resistor 30e can be established according to the following equation (4-7).

$$R_{205} = \frac{\tau}{\left(\frac{5-3}{5}\right) \cdot C_{205}} \quad (4\text{-}7)$$

The following equations (4-8) and (4-9) can be derived from equation (4-5) and equation (4-7).

$$C_{203} = \quad (4\text{-}8)$$
$$\frac{3}{3-2} \cdot \frac{\tau}{R_{203}} + \frac{5}{3-2} \cdot \frac{5-3}{5} \cdot C_{205} = \frac{3}{3-2} \cdot \frac{\tau}{R_{203}} + \frac{5-3}{3-2} \cdot C_{205}$$

$$R_{203} = \quad (4\text{-}9)$$
$$\frac{\tau}{\frac{3-2}{3} \cdot C_{203} - \frac{3-2}{3} \cdot \frac{5-3}{3-2} \cdot C_{205}} = \frac{\tau}{\frac{3-2}{3} \cdot C_{203} - \frac{5-3}{3} \cdot C_{205}}$$

The following equations (4-10) and (4-11) can be derived from equations (4-4), (4-7), and (4-9).

$$C_{202} = \frac{\tau}{R_{202}} + \frac{3}{2} \cdot \left(\frac{3-2}{3} \cdot C_{203} - \frac{5-3}{3} \cdot C_{205}\right) + \frac{5}{2} \cdot \frac{5-3}{5} \cdot C_{205} \quad (4\text{-}10)$$
$$= \frac{\tau}{R_{202}} + \frac{3-2}{2} \cdot C_{203} - \frac{5-3}{2} \cdot C_{205} + \frac{5-3}{2} \cdot C_{205}$$
$$= \frac{\tau}{R_{202}} + \frac{3-2}{2} \cdot C_{203}$$

$$R_{202} = \frac{\tau}{C_{202} - \frac{3-2}{2} \cdot C_{203}} \quad (4\text{-}11)$$

According to the above-described process, it is possible to establish the electrostatic capacitances $C_{202}$, $C_{203}$, $C_{205}$ of the dividing capacitors 232i, 232j, 232k, and the resistance values $R_{202}$, $R_{203}$, $R_{205}$ of the resistors 30b, 30c, 30e.

B-3. Specific Inventive Examples

B-3-1. Second Inventive Example

Figure 17:
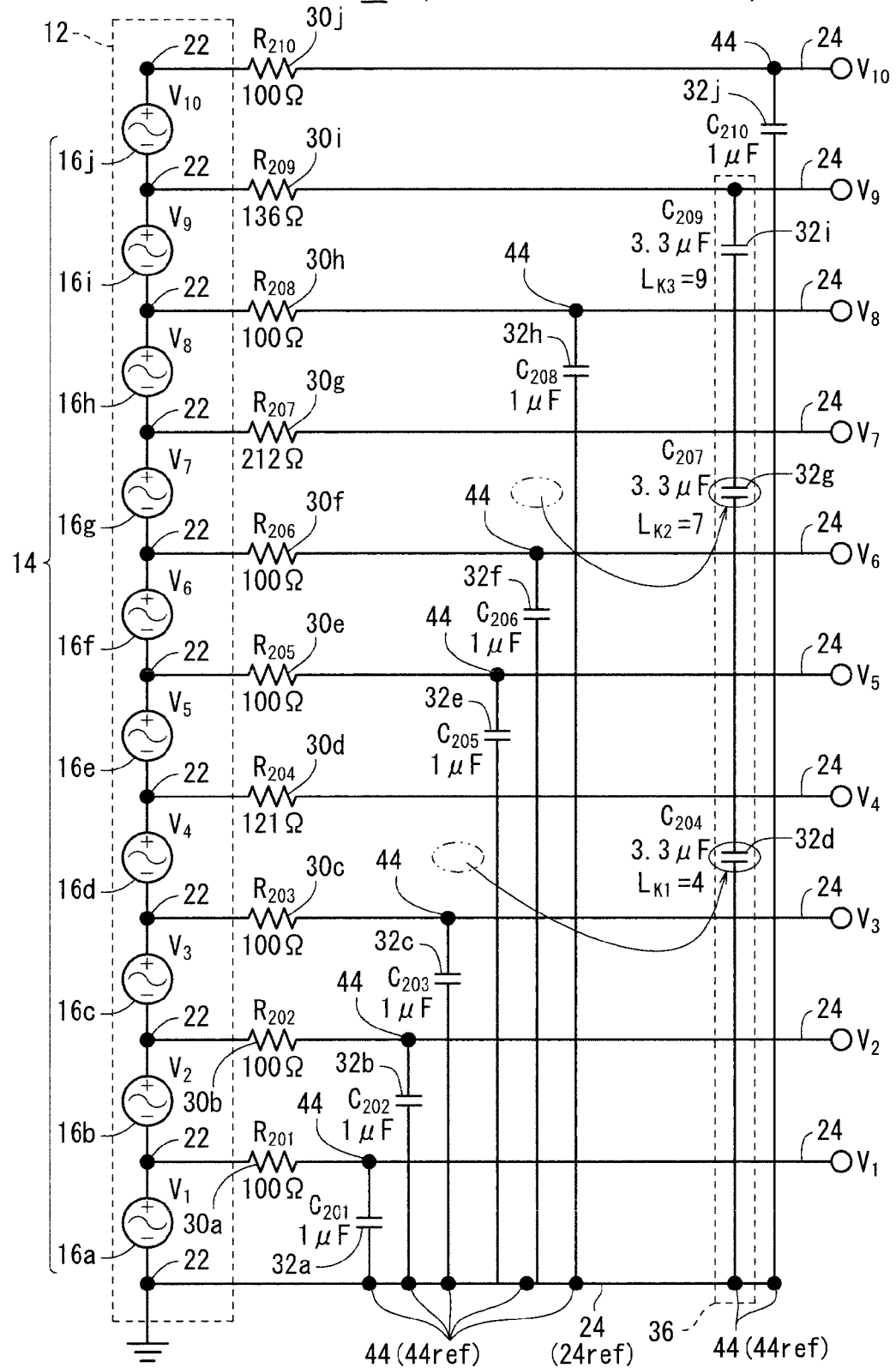
FIG. 17 is a diagram showing a specific example (second inventive example) of numerical values of resistors and capacitors in the arrangement of the voltage measuring device shown in FIG. 12.

FIG. 17 is a diagram showing a specific example (second inventive example) of numerical values for the resistors 30 (30a through 30j) and the capacitors 32 (32a through 32j) in the arrangement of the voltage measuring device 10A shown in FIG. 12. As shown in FIG. 17, a voltage measuring device 10b according to the second inventive example has capacitors 32a through 32c, 32e, 32f, 32h, 32j, which serve as non-dividing capacitors 32nd(first capacitors 32nd), and capacitors 32d, 32g, 32i, which serve as dividing capacitors 32div (second capacitors 32div), used in combination. Consequently, it is possible to increase the degree of freedom with which the RC filters are designed, while at the same time lowering withstand voltage limits for the capacitors 32.

The voltage measuring device 10b shown in FIG. 17 is designed according to the following sequence, for example. First, a required time constant τ is established. According to the second inventive example, the time constant τ=100 μsec.

Thereafter, electrostatic capacitances $C_{20x}$ of the capacitors 32 are determined. According to the second inventive example, the product of the electrostatic capacitances $C_{201}$ through $C_{203}$, $C_{205}$, $C_{206}$, $C_{208}$, and $C_{210}$ of the non-dividing capacitors 32a through 32c, 32e, 32f, 32h, and 32j, and the resistance values $R_{201}$ through $R_{203}$, $R_{205}$, $R_{206}$, $R_{208}$, and $R_{210}$ of the resistors 30a through 30c, 30e, 30f, 30h, and 30j, which are paired with the non-dividing capacitors 32a through 32c, 32e, 32f, 32h, and 32j, is represented by τ. Therefore, the electrostatic capacitances $C_{201}$ through $C_{203}$, $C_{205}$, $C_{206}$, $C_{208}$, and $C_{210}$ of the non-dividing capacitors 32a through 32c, 32e, 32f, 32h, and 32j can be established comparatively freely.

According to the second inventive example, each of the electrostatic capacitances $C_{201}$ through $C_{203}$, $C_{205}$, $C_{206}$, $C_{208}$, and $C_{210}$ of the non-dividing capacitors 32a through 32c, 32e, 32f, 32h, and 32j is established as 1 μF. Accordingly, each of the resistance values $R_{201}$ through $R_{203}$, $R_{205}$, $R_{206}$, $R_{208}$, and $R_{210}$ of the resistors 30a through 30c, 30e, 30f, 30h, and 30j is established as 100Ω.

The electrostatic capacitances $C_{204}$, $C_{207}$, $C_{209}$ of the dividing capacitors 32d, 32g, 32i, which satisfy the above inequalities (3-1) and (3-2), are established as 3.3 μF each.

The resistance values $R_{204}$, $R_{207}$, and $R_{209}$ of the resistors 30d, 30g, and 30i, which are paired with the dividing capacitors 32d, 32g, 32i, are established as 121Ω, 212Ω, and 136Ω (rounded off to whole numbers), respectively, based on equations (3-3), (3-4), and (3-5) and the electrostatic capacitances $C_{204}$, $C_{207}$, and $C_{209}$. In the inequalities and equations (3-1) through (3-5), $L_{k1}$, $L_{k2}$, $L_{k3}$ (i.e., the numbers of the non-reference lines 24n from the reference line 24ref to the non-reference lines 24n that are connected to the respective terminals of the capacitors 32d, 32g, 32i, which are located remotely (toward the positive pole side) from the reference line 24ref) are represented by 4, 7, and 9, respectively.

With the arrangement shown in FIG. 17, similar to the case shown in FIG. 7, it is possible to realize a certain time constant τ and to make the frequency characteristics of the RC filters uniform.

B-3-2. Third Inventive Example

Figure 18:
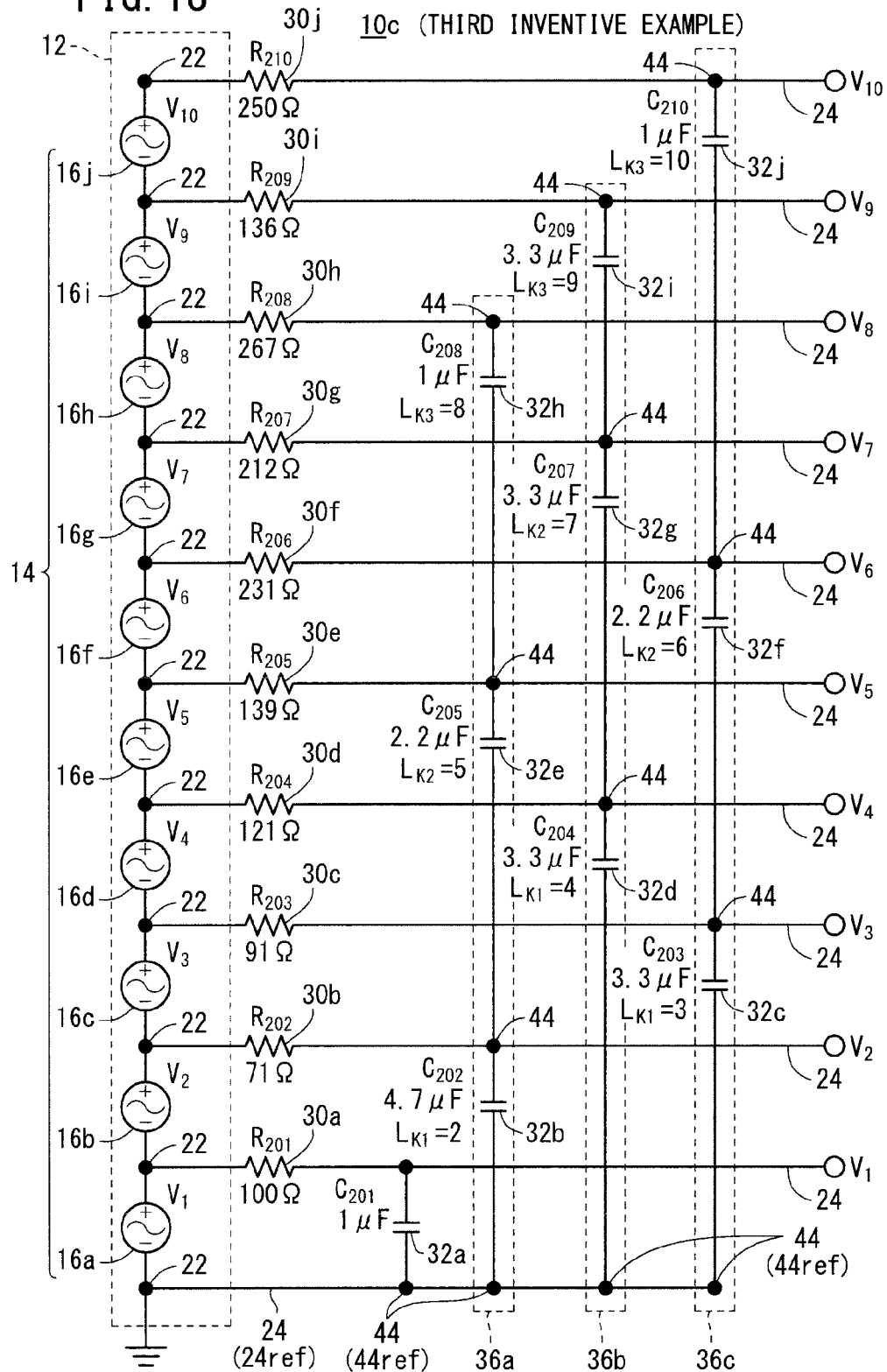
FIG. 18 is a diagram showing a specific example (third inventive example) of numerical values of resistors and capacitors in an arrangement (modification of FIG. 12) including plural combinations of three RC filters.

FIG. 18 is a diagram showing a specific example (third inventive example) of numerical values for the resistors 30 (30a through 30j) and the capacitors 32 (32a through 32j) in an arrangement (modification of FIG. 12) that includes plural combinations of three RC filters. As shown in FIG. 18, a voltage measuring device 10c according to the third inventive example has a capacitor 32a, which serves as a non-dividing capacitor 32nd(first capacitor 32nd), and capacitors 32b through 32j, which serve as dividing capacitors 32div (second capacitors 32div), used in combination.

The dividing capacitors 32b, 32e, 32h make up a first dividing capacitor group 36a (first series-connected capacitor group 36a), the dividing capacitors 32d, 32g, 32i make up a second dividing capacitor group 36b (second series-connected capacitor group 36b), and the dividing capacitors 32c, 32f, 32j make up a third dividing capacitor group 36c (third series-connected capacitor group 36c). Consequently, it is possible to increase the degree of freedom with which the RC filters are designed, while at the same time lowering withstand voltage limits for the dividing capacitors 32b through 32j.

The voltage measuring device 10c shown in FIG. 18 is designed according to the following sequence, for example. First, a required time constant τ is established. According to the third inventive example, the time constant τ=100 μsec.

Thereafter, electrostatic capacitances $C_{20x}$ of the capacitors 32 are determined. According to the third inventive example, the product of the electrostatic capacitance $C_{201}$ of the non-dividing capacitor 32a and the resistance value $R_{201}$ of the resistor 30a, which is paired with the non-dividing capacitor 32a, is represented by τ. Therefore, the electrostatic capacitance $C_{201}$ of the non-dividing capacitor 32a can be established comparatively freely. According to the third inventive example, the electrostatic capacitance $C_{201}$ of the non-dividing capacitor 32a is established as 1 μF. Accordingly, the resistance value $R_{201}$ of the resistor 30a, which is paired with the non-dividing capacitor 32a, is established as 100Ω.

The electrostatic capacitances $C_{202}$ through $C_{210}$ of the dividing capacitors 32b through 32j, which satisfy the above inequalities (3-1) and (3-2) for the first through third dividing capacitor groups 36a through 36c, are established as $C_{202}$=4.7 μF, $C_{203}$=$C_{204}$=$C_{207}$=$C_{209}$=3.3 μF, $C_{205}$=$C_{206}$=2.2 μF, $C_{208}$=$C_{210}$=1 μF.

The resistance values $R_{202}$ through $R_{210}$ of the resistors 30b through 30j, which are paired with the dividing capacitors 32b through 32j, are established based on equations (3-3), (3-4), and (3-5) and the electrostatic capacitances $C_{202}$ through $C_{210}$ for the first through third dividing capacitor groups 36a through 36c. More specifically, $R_{202}$=71Ω, $R_{203}$=91Ω, $R_{204}$=121Ω, $R_{205}$=139Ω, $R_{206}$=231Ω, $R_{207}$=212Ω, $R_{208}$=267Ω, $R_{209}$=136Ω, $R_{210}$=250Ω (rounded off to whole numbers).

With respect to the first dividing capacitor group 36a, in the inequalities and equations (3-1) through (3-5), the numbers $L_{k1}$, $L_{k2}$, and $L_{k3}$ (i.e., the numbers of the non-reference lines 24n from the reference line 24ref to the non-reference lines 24n that are connected to the respective terminals of the capacitors 32b, 32e, 32h, which are located remotely (toward the positive pole side) from the reference line 24ref), are represented by 2, 5, and 8, respectively. With respect to the second dividing capacitor group 36b, in the inequalities and equations (3-1) through (3-5), the numbers $L_{k1}$, $L_{k2}$, and $L_{k3}$ (i.e., the numbers of the non-reference lines 24n from the reference line 24ref to the non-reference lines 24n that are connected to the respective terminals of the capacitors 32d, 32g, 32i, which are located remotely (toward the positive pole side) from the reference line 24ref), are represented by 4, 7, and 9, respectively. With respect to the third dividing capacitor group 36c, in the inequalities and equations (3-1) through (3-5), $L_{k1}$, $L_{k2}$, and $L_{k3}$ (i.e., the numbers of the non-reference lines 24n from the reference line 24ref to the non-reference lines 24n that are connected to the respective terminals of the capacitors 32c, 32f, 32j, which are located remotely (toward the positive pole side) from the reference line 24ref), are represented by 3, 6, and 10, respectively.

With the arrangement shown in FIG. 18, similar to the case with FIG. 7, it is possible to realize a certain time constant τ and to make the frequency characteristics of the RC filters uniform.

B-4. Advantages of the Second Embodiment

The second embodiment has an arrangement in which three RC filters are combined, whereas the third embodiment, to be described later, has an arrangement in which the number of combined RC filters is not limited (a more general arrangement). Therefore, the advantages of the second embodiment will be described in detail along with the advantages of the third embodiment.

C. Third Embodiment (Arrangement in which a Plurality of RC Filters are Combined)

C-1. Overall Arrangement

Figure 19:
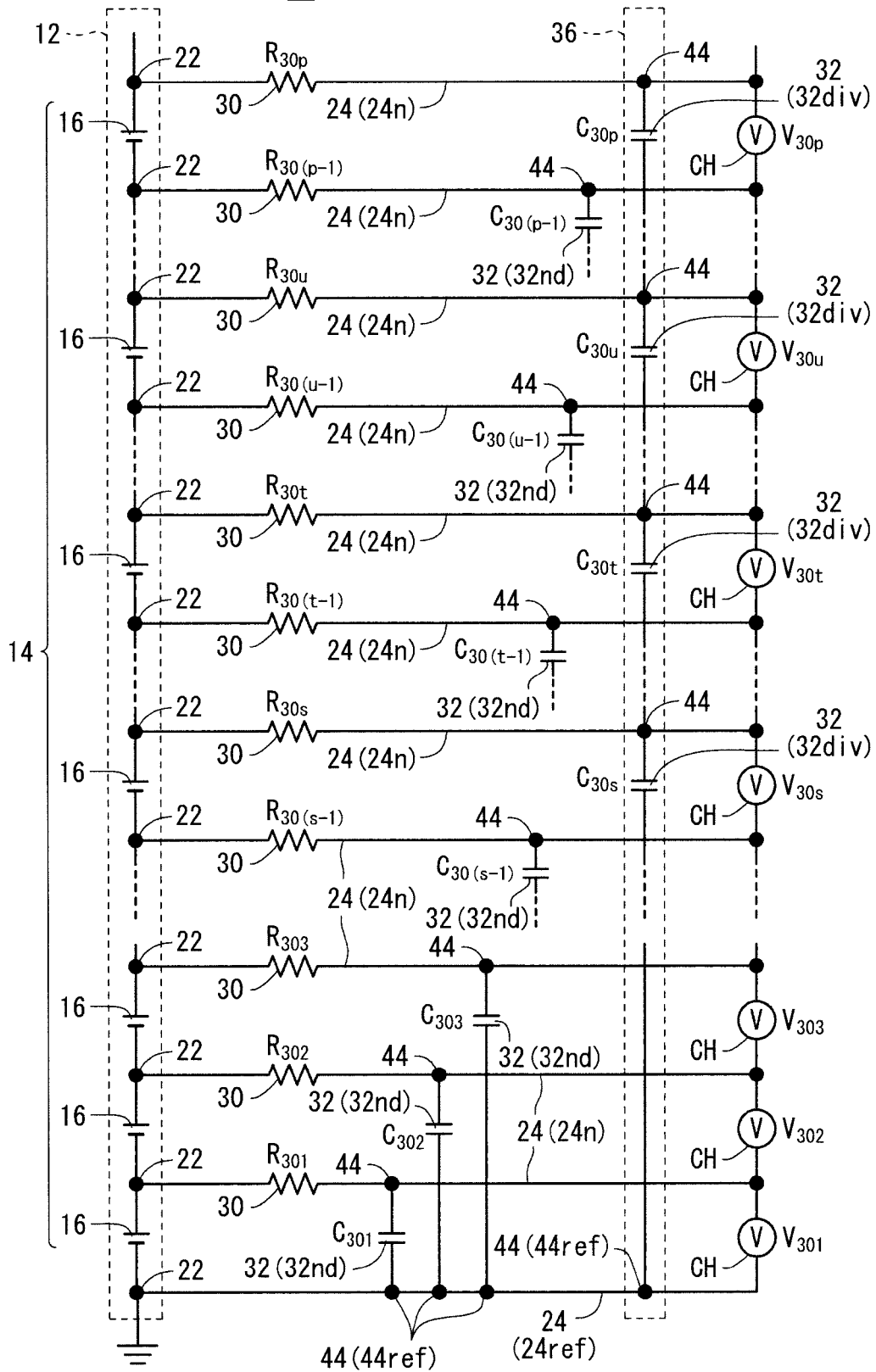
FIG. 19 is a circuit diagram showing a portion of a voltage measuring device according to a third embodiment of the present invention.

FIG. 19 is a circuit diagram showing a portion of a voltage measuring device 10B according to a third embodiment of the present invention. The voltage measuring device 10B according to the third embodiment has an arrangement in which the number of RC filters is not limited, which is provided by generalizing, respectively, the voltage measuring device 10 according to the first embodiment and the voltage measuring device 10A according to the second embodiment.

More specifically, the voltage measuring device 10B measures a voltage across a battery assembly 12 (i.e., module voltages Vm across respective modules 16) comprising a module array 14 made up of p series-connected battery modules 16 (where p represents an integer of 3 or greater). Although not shown in FIG. 19, the voltage measuring device 10B also includes the voltage measuring circuit 18, the processor 20, the switches 38, and the controller 40, similar to the case of the first embodiment (FIG. 1).

The voltage measuring circuit 18 of the voltage measuring device 10B is connected to positive and negative pole sides of the modules 16 by p+1 lines 24, which are connected to junctions between the modules 16 and opposite ends of the module array 14. Among the p+1 lines 24, p lines 24 have p resistors 30, respectively. The line 24, which is free of a resistor 30, is referred to as a "reference line 24ref", whereas the lines 24 having resistors 30 are referred to as "non-reference lines 24n".

The reference line 24ref is positioned on the negativemost pole side (lowermost side in FIG. 19) of the module array 14. However, as will be described later, the reference line 24ref may be positioned at another location. The reference line 24ref need not be a single reference line, but may be made up from a plurality of reference lines, as described later. The voltage measuring device 10B includes p capacitors 32, which are combined with the resistors 30, thereby making up RC filters.

The capacitors 32 include non-dividing capacitors 32nd (first capacitors 32nd), which are not connected in series to other capacitors 32, and dividing capacitors 32div (second capacitors 23div), which are connected in series to other capacitors 32. The dividing capacitors 32div make up at least one dividing capacitor group 36 (series-connected capacitor group 36).

For illustrative purposes, the resistance value of each of the resistors is denoted by $R_{30x}$ in FIG. 19, where the subscript "x" represents an integer in a range from 1 to p, and indicates the location thereof counted from the reference line 24ref. For example, the resistance value of the resistor 30 on the first non-reference line 24n from the reference line 24ref is denoted by $R_{301}$. The total number of resistors 30 is represented by p.

Similarly, for illustrative purposes, the electrostatic capacitance of each of the capacitors 32 is denoted by $C_{30x}$ in FIG. 19, where the subscript "x" indicates the location counted from the reference line 24ref, as described above. For example, the electrostatic capacitance of the first capacitor 32 from the reference line 24ref is denoted by $C_{301}$, and the electrostatic capacitance of the second capacitor 32 from the reference line 24ref by $C_{302}$. The total number of capacitors 32 is the same as the module number p. In FIG. 19, "s", "t", and "u" represent integers that satisfy the inequality 3<s−1<s<t−1<t<u−1<u<p−1<p.

C-2. Basic Concept of Resistance Value $R_{30}$, and Electrostatic Capacitance $C_{30n}$ A process of establishing the resistance value $R_{30n}$ of a resistor 30 and the electrostatic capacitance $C_{30n}$ of a capacitor 32 in accordance with the third embodiment will be described below. According to the third embodiment, in which plural RC filters are combined, the resistance value $R_{30n}$ and the electrostatic capacitance $C_{30n}$ are established in the following manner.

With respect to a non-dividing capacitor 32nd, the resistance value $R_{30n}$ and the electrostatic capacitance $C_{30n}$ thereof are established such that the time constant of each RC filter will be of a characteristic value τ. Stated otherwise, the resistance value $R_{30n}$ and the electrostatic capacitance $C_{30n}$ can be set to any values, insofar as the product of the resistance value $R_{30n}$ and the electrostatic capacitance $C_{30n}$ is represented by τ.

With respect to a dividing capacitor 32div, the following definitions are given in relation to the dividing capacitor group 36.

n: the number of dividing capacitors 32div
m: an integer in a range from 2 to n−1
q: an integer in a range from 1 to n
$k_q$: the number of dividing capacitors 32div from the reference line 24ref to a dividing capacitor 32div in question (including a dividing capacitor 32div in question)
$L_{kq}$: the number of non-reference lines 24n from the reference line 24ref to a non-reference line 24n that is connected to the terminal of the $k_q$th dividing capacitor 32div remote from the reference line 24ref (the positive pole side terminal of the dividing capacitor 32div in FIG. 19)
$C_{kq}$: the electrostatic capacitance of the $k_q$th dividing capacitor 32div
$R_{kq}$: the resistance value of the resistor 30 that is connected to the $k_q$th dividing capacitor 32div In FIG. 19, $k_1$ corresponds to the capacitor 32 having an electrostatic capacitance $C_{30s}$, $k_2$ corresponds to the capacitor 32 having an electrostatic capacitance $C_{30t}$, $k_3$ corresponds to the capacitor 32 having an electrostatic capacitance $C_{30u}$, and $k_4$ corresponds to the capacitor 32 having an electrostatic capacitance $C_{30p}$. The number $L_{k1}$ corresponding to the capacitor 32 having the electrostatic capacitance $C_{30s}$ is represented by "s", the number $L_{k2}$ corresponding to the capacitor 32 having the electrostatic capacitance $C_{30t}$ is represented by "t", the number $L_{k3}$ corresponding to the capacitor 32 having the electrostatic capacitance $C_{30u}$ is represented by "u", and the number $L_{k4}$ corresponding to the capacitor 32 having the electrostatic capacitance $C_{30p}$ is represented by "p".

According to the above definitions, the electrostatic capacitance $C_{kq}$ of each dividing capacitor 32div is established to satisfy inequalities (5-1) and (5-2) below, and the resistance $R_{kx}$ of each resistor 30 is established to satisfy equations (5-3), (5-4), and (5-5) below.

$$C_{k1} > C_{k2} \cdot \frac{(L_{k2} - L_{k1})}{L_{k1}} \quad (5\text{-}1)$$

$$C_{km} > C_{k(m+1)} \cdot \frac{(L_{k(m+1)} - L_{km})}{(L_{km} - L_{k(m-1)})} \quad (5\text{-}2)$$

$$R_{k1} = \frac{\tau}{C_{k1} - \left\{ C_{k2} \cdot \frac{(L_{k2} - L_{k1})}{L_{k1}} \right\}} \quad (5\text{-}3)$$

$$R_{km} = \frac{\tau}{C_{km} \cdot \left\{ \frac{(L_{km} - L_{k(m-1)})}{L_{km}} \right\} - C_{k(m+1)} \cdot \left\{ \frac{(L_{k(m+1)} - L_{km})}{L_{km}} \right\}} \quad (5\text{-}4)$$

$$R_{kn} = \frac{\tau}{C_{kn} \cdot \left\{ \frac{(L_{kn} - L_{k(n-1)})}{L_{kn}} \right\}} \quad (5\text{-}5)$$

C-3. Specific Examples

C-3-1. Fourth Inventive Example

Figure 20:
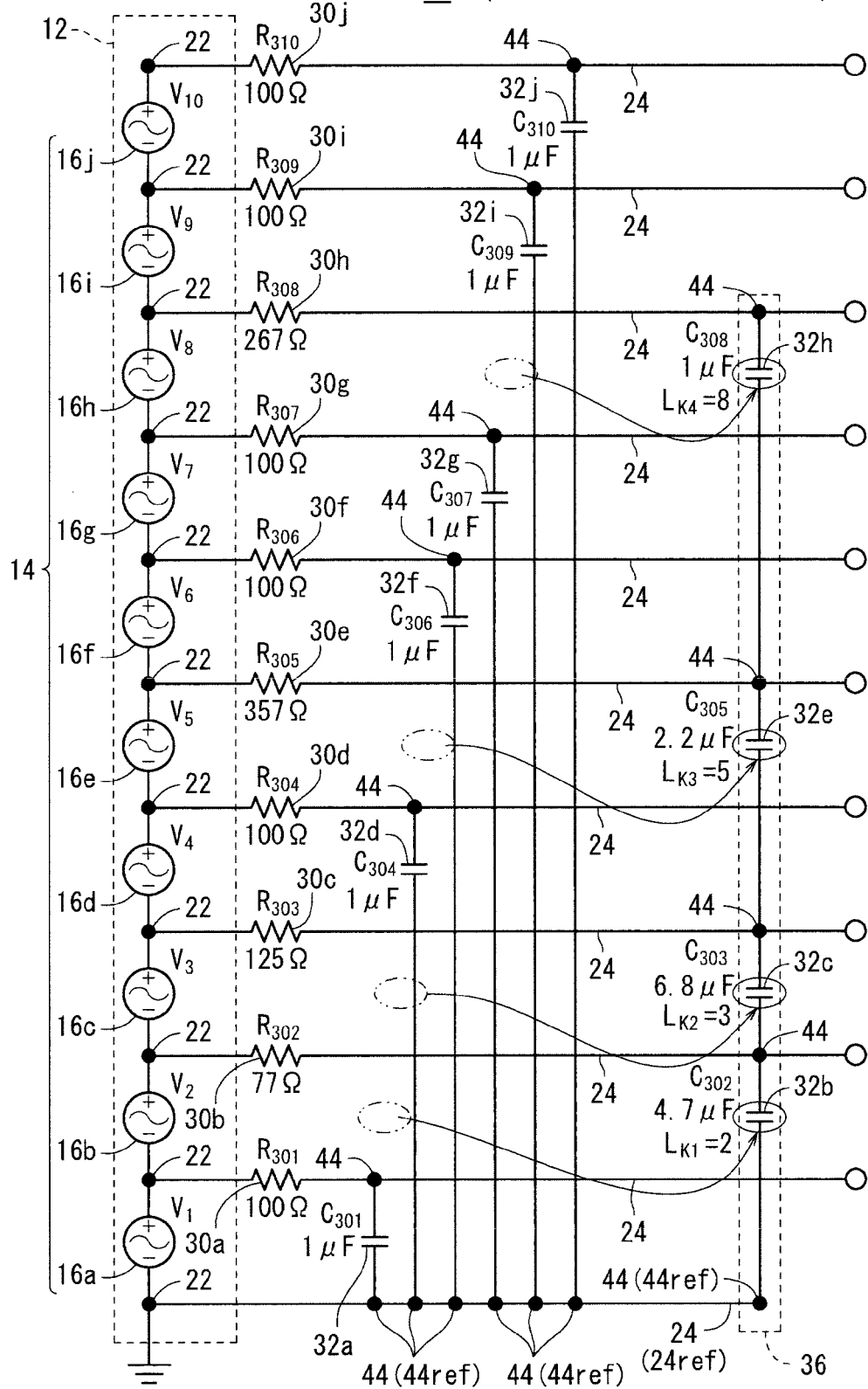
FIG. 20 is a diagram showing a specific example (fourth inventive example) of numerical values of resistors and capacitors in the arrangement of the voltage measuring device shown in FIG. 19.

FIG. 20 is a diagram showing a specific example (fourth inventive example) of numerical values for the resistors 30 (30a through 30j) and the capacitors 32 (32a through 32j) in the arrangement of the voltage measuring device 10B shown in FIG. 19. As shown in FIG. 20, a voltage measuring device 10d according to the fourth inventive example has capacitors 32a, 32d, 32f, 32g, 32i, 32j, which serve as non-dividing capacitors 32nd(first capacitors 32nd), and capacitors 32b, 32c, 32e, 32h, which serve as dividing capacitors 32div (second capacitors 32div), used in combination. Consequently, it is possible to increase the degree of freedom with which the RC filters are designed, while at the same time lowering withstand voltage limits for the capacitors 32.

The voltage measuring device 10d shown in FIG. 20 is designed according to the following sequence, for example. First, a required time constant τ is established. According to the fourth inventive example, τ=100 μsec.

Thereafter, electrostatic capacitances $C_{30x}$ of the capacitors 32 are determined. According to the fourth inventive example, the product of the electrostatic capacitances $C_{301}$, $C_{304}$, $C_{306}$, $C_{307}$, $C_{309}$, $C_{310}$ of the non-dividing capacitors 32a, 32d, 32f, 32g, 32i, 32j and the resistance values $R_{301}$, $R_{304}$, $R_{306}$, $R_{307}$, $R_{309}$, $R_{310}$ of the resistors 30a, 30d, 30f, 30g, 30i, 30j, which are paired with the non-dividing capacitors 32a, 32d, 32f, 32g, 32i, 32j, is represented by τ. Therefore, the electrostatic capacitances $C_{301}$, $C_{304}$, $C_{306}$, $C_{307}$, $C_{309}$, $C_{310}$ of the non-dividing capacitors 32a, 32d, 32f, 32g, 32i, 32j can be established comparatively freely.

According to the fourth inventive example, each of the electrostatic capacitances $C_{301}$, $C_{304}$, $C_{306}$, $C_{307}$, $C_{309}$, $C_{310}$ of the non-dividing capacitors 32a, 32d, 32f, 32g, 32i, 32j is established as 1 μF. Accordingly, each of the resistance values $R_{301}$, $R_{304}$, $R_{306}$, $R_{307}$, $R_{309}$, $R_{310}$ of the resistors 30a, 30d, 30f, 30g, 30i, 30j, which are paired with the non-dividing capacitors 32a, 32d, 32f, 32g, 32i, 32j, is established as 100Ω.

The electrostatic capacitances $C_{302}$, $C_{303}$, $C_{305}$, $C_{308}$ of the dividing capacitors 32b, 32c, 32e, 32h, which satisfy the above inequalities (5-1) and (5-2), are established as 4.7 μF, 6.8 μF, 2.2 μF, 1 μF, respectively.

The resistance values $R_{302}$, $R_{303}$, $R_{305}$, $R_{308}$ of the resistors 30b, 30c, 30e, 30h, which are paired with the dividing capacitors 32b, 32c, 32e, 32h, are established based on equations (5-3), (5-4), and (5-5) and the electrostatic capacitances $C_{302}$, $C_{303}$, $C_{305}$, $C_{308}$. More specifically, $R_{302}=77\Omega$, $R_{303}=125\Omega$, $R_{305}=357\Omega$, $R_{308}=267\Omega$ (rounded off to whole numbers).

In the inequalities and equations (5-1) through (5-5), the numbers $L_{k1}$, $L_{k2}$, $L_{k3}$, and $L_{k4}$ (i.e., the numbers of the non-reference lines 24n from the reference line 24ref to the non-reference lines 24n that are connected to the respective terminals of the capacitors 32b, 32c, 32e, 32h that are located remotely (toward the positive pole side) from the reference line 24ref) are represented by 2, 3, 5, and 8, respectively.

With the arrangement shown in FIG. 20, as shown in FIG. 7, it is possible to realize a certain time constant $\tau$ and to make the frequency characteristics of the RC filters uniform.

C-3-2. Fifth Inventive Example

As described above, the reference line 24ref need not necessarily be positioned on the negative-most pole side of the module array 14. The reference line 24ref may be positioned somewhere else.

Figure 21:
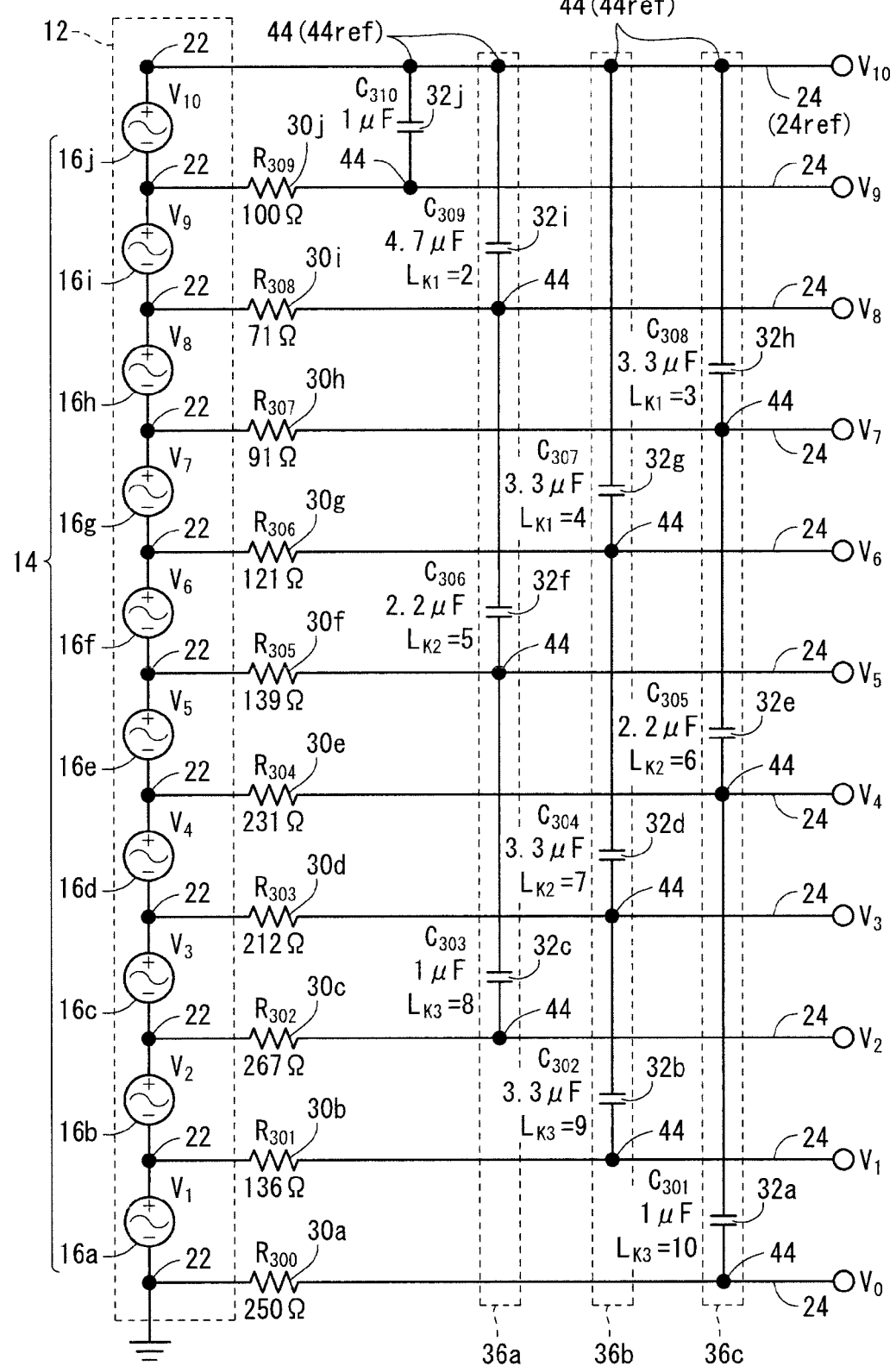
FIG. 21 is a diagram showing a specific example (fifth inventive example) of numerical values of resistors and capacitors in an arrangement (modification of FIG. 19), which makes use of a positive-most pole line of a module array as a reference line, and which has three dividing capacitor groups (series-connected capacitor groups)

FIG. 21 is a diagram showing a specific example (fifth inventive example) of numerical values for the resistors 30 (30a through 30j) and the capacitors 32 (32a through 32j) in an arrangement (modification of FIG. 19), which uses the positive-most pole line 24 of the module array 14 as the reference line 24ref, and which has three dividing capacitor groups 36 (series-connected capacitor groups 36).

As shown in FIG. 21, a voltage measuring device 10e according to the fifth inventive example has a capacitor 32j, which serves as a non-dividing capacitor 32nd(first capacitor 32nd), and capacitors 32a through 32i, which serve as dividing capacitors 32div (second capacitors 32div), used in combination. The dividing capacitors 32c, 32f, 32i make up a first dividing capacitor group 36a (first series-connected capacitor group 36a). The dividing capacitors 32b, 32d, 32g make up a second dividing capacitor group 36b (second series-connected capacitor group 36b). The dividing capacitors 32a, 32e, 32h make up a third dividing capacitor group 36c (third series-connected capacitor group 36c). Consequently, it is possible to increase the degree of freedom with which the RC filters are designed, while at the same time lowering withstand voltage limits for the dividing capacitors 32a through 32i.

In FIG. 21, for easier understanding of the fifth inventive example (by way of comparison with the first through fourth inventive examples), the term "x" in the resistance values $R_{30x}$ of the resistors 30 represents an integer in a range from 0 to 9.

The voltage measuring device 10e shown in FIG. 21 is designed according to the following sequence, for example. First, a required time constant $\tau$ is established. According to the fifth inventive example, $\tau=100$ μsec.

Thereafter, electrostatic capacitances $C_{30}$, of the capacitors 32 are determined. According to the fifth inventive example, the product of the electrostatic capacitance $C_{310}$ of the non-dividing capacitor 32j and the resistance value $R_{309}$ of the resistor 30j, which is paired with the non-dividing capacitor 32j, is represented by $\tau$. Therefore, the electrostatic capacitance $C_{310}$ of the non-dividing capacitor 32j can be established comparatively freely. According to the fifth inventive example, the electrostatic capacitance $C_{310}$ of the non-dividing capacitor 32j is established as 1 μF. Accordingly, the resistance value $R_{309}$ of the resistor 30j, which is paired with the non-dividing capacitor 32j, is established as 100Ω.

The electrostatic capacitances $C_{301}$ through $C_{309}$ of the dividing capacitors 32a through 32i, which satisfy the above inequalities (5-1) and (5-2) for the first through third dividing capacitors 36a through 36c, are established as $C_{301}=C_{303}=1$ μF, $C_{302}=C_{304}=C_{307}=C_{308}=3.3$ μF, $C_{305}=C_{306}=2.2$ μF, $C_{309}=4.7$ μF.

In the fifth inventive example, as shown in FIG. 21, the reference line 24ref is positioned in an uppermost position. In the first dividing capacitor group 36a, as shown in FIG. 21, $k_1$ corresponds to the capacitor 32i having an electrostatic capacitance $C_{309}$, $k_2$ corresponds to the capacitor 32f having an electrostatic capacitance $C_{306}$, and $k_3$ corresponds to the capacitor 32c having an electrostatic capacitance $C_{303}$. In the second dividing capacitor group 36b, $k_1$ corresponds to the capacitor 32g having an electrostatic capacitance $C_{307}$, $k_2$ corresponds to the capacitor 32d having an electrostatic capacitance $C_{304}$, and $k_3$ corresponds to the capacitor 32b having an electrostatic capacitance $C_{302}$. In the third dividing capacitor group 36c, $k_1$ corresponds to the capacitor 32h having an electrostatic capacitance $C_{308}$, $k_2$ corresponds to the capacitor 32e having an electrostatic capacitance $C_{305}$, and $k_3$ corresponds to the capacitor 32a having an electrostatic capacitance $C_{301}$.

The resistance values $R_{300}$ through $R_{308}$ of the resistors 30a through 30i, which are paired with the dividing capacitors 32a through 32i, are established based on equations (5-3), (5-4), and (5-5) and the electrostatic capacitances $C_{301}$ through $C_{309}$. More specifically, $R_{300}=250\Omega$, $R_{301}=136\Omega$, $R_{302}=267\Omega$, $R_{303}=212\Omega$, $R_{304}=231\Omega$, $R_{305}=139\Omega$, $R_{306}=121\Omega$, $R_{307}=91\Omega$, and $R_{308}=71\Omega$ (rounded off to whole numbers).

In the first dividing capacitor group 36a, the number $L_{k1}$ corresponding to the capacitor 32i having the electrostatic capacitance $C_{309}$ is represented by 2, the number $L_{k2}$ corresponding to the capacitor 32f having the electrostatic capacitance $C_{306}$ is represented by 5, and the number $L_{k3}$ corresponding to the capacitor 32c having the electrostatic capacitance $C_{303}$ is represented by 8. In the second dividing capacitor group 36b, the number $L_{k1}$ corresponding to the capacitor 32g having the electrostatic capacitance $C_{307}$ is represented by 4, the number $L_{k2}$ corresponding to the capacitor 32d having the electrostatic capacitance $C_{304}$ is represented by 7, and the number $L_{k3}$ corresponding to the capacitor 32b having the electrostatic capacitance $C_{302}$ is represented by 9. In the third dividing capacitor group 36c, the number $L_{k1}$ corresponding to the capacitor 32h having the electrostatic capacitance $C_{308}$ is represented by 3, the number $L_{k2}$ corresponding to the capacitor 32e having the electrostatic capacitance $C_{305}$ is represented by 6, and the number $L_{k3}$ corresponding to the capacitor 32a having the electrostatic capacitance $C_{301}$ is represented by 10.

With the arrangement shown in FIG. 21, it is possible to realize a certain time constant $\tau$ and to make the frequency characteristics of the RC filters uniform, as shown in FIG. 7.

C-3-3. Sixth Inventive Example

Figure 22:
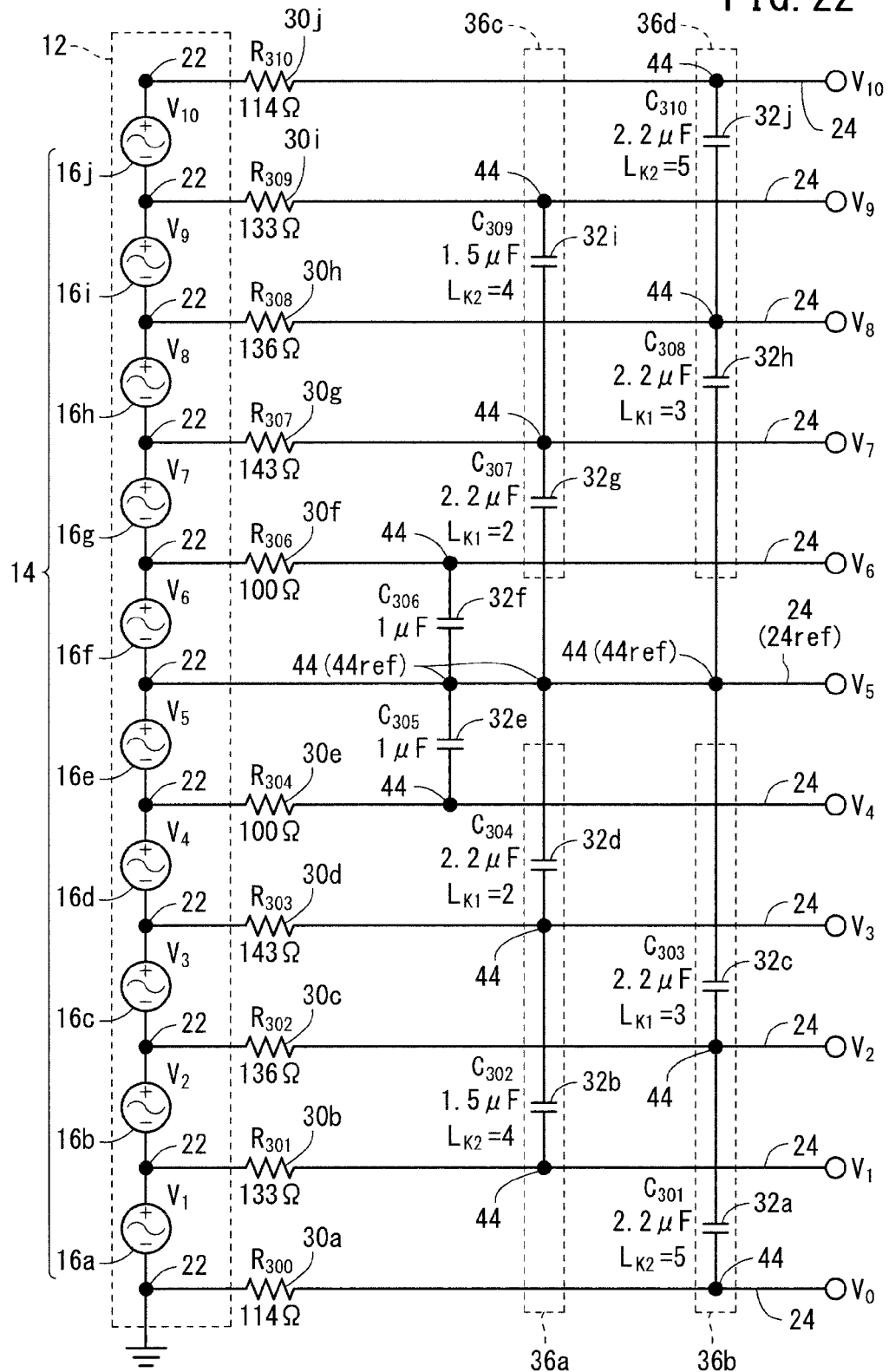
FIG. 22 is a diagram showing a specific example (sixth inventive example) of numerical values of resistors and capacitors in an arrangement (modification of FIG. 19), which makes use of a central line of a module array as a reference line, and which has four dividing capacitor groups (series-connected capacitor groups)

FIG. 22 is a diagram showing a specific example (sixth inventive example) of numerical values for the resistors 30 (30a through 30j) and the capacitors 32 (32a through 32j) in an arrangement (modification of FIG. 19), which uses the central line 24 of the module array 14 as the reference line 24ref, and which has four dividing capacitor groups 36 (series-connected capacitor groups 36).

As shown in FIG. 22, a voltage measuring device 10f according to the sixth inventive example has capacitors 32e, 32f, which serve as non-dividing capacitors 32nd (first capacitors 32nd), and capacitors 32a through 32d and 32g through 32j, which serve as dividing capacitors 32div (second capacitors 32div), used in combination.

The dividing capacitors 32b, 32d make up a first dividing capacitor group 36a (first series-connected capacitor group 36a). The dividing capacitors 32a, 32c make up a second dividing capacitor group 36b (second series-connected capacitor group 36b). The dividing capacitors 32g, 32i make up a third dividing capacitor group 36c (third series-connected capacitor group 36c). The dividing capacitors 32h, 32j make up a fourth dividing capacitor group 36d (fourth series-connected capacitor group 36d). Consequently, it is possible to increase the degree of freedom with which the RC filters are designed, while at the same time lowering withstand voltage limits for the dividing capacitors 32a through 32d and 32g through 32j.

As shown in FIG. 22, the reference line 24ref is positioned at the center of the module array 14. Therefore, the first dividing capacitor group 36a, which is made up of the dividing capacitors 32b, 32d, and the third dividing capacitor group 36c, which is made up of the dividing capacitors 32g, 32i, form separate dividing capacitor groups. Likewise, the second dividing capacitor group 36b, which is made up of the dividing capacitors 32a, 32c, and the fourth dividing capacitor group 36d, which is made up of the dividing capacitors 32h, 32j, form separate dividing capacitor groups. On the other hand, the capacitors 32e, 32f are not dividing capacitors 32div, but are non-dividing capacitors 32nd.

In FIG. 22, for easier understanding of the sixth inventive example (by way of comparison with the first through fifth inventive examples), the term "x" in the resistance values $R_{30x}$ of the resistors 30 represents an integer that ranges from 0 to 4 and from 6 to 10.

The voltage measuring device 10f shown in FIG. 22 is designed according to the following sequence, for example. First, a required time constant $\tau$ is established. According to the sixth inventive example, $\tau = 100$ μsec.

Thereafter, electrostatic capacitances $C_{30n}$ of the capacitors 32 are determined. According to the sixth inventive example, the product of the electrostatic capacitances $C_{305}$, $C_{306}$ of the non-dividing capacitors 32e, 32f and the resistance values $R_{304}$, $R_{306}$ of the resistors 30e, 30f, which are paired with the non-dividing capacitors 32e, 32f, is represented by $\tau$. Therefore, the electrostatic capacitances $C_{305}$, $C_{306}$ of the non-dividing capacitors 32e, 32f can be established comparatively freely. According to the sixth inventive example, each of the electrostatic capacitances $C_{305}$, $C_{306}$ of the non-dividing capacitors 32e, 32f is established as 1 μF. Accordingly, each of the resistance values $R_{304}$, $R_{306}$ of the resistors 30e, 30f, which are paired with the non-dividing capacitors 32e, 32f, is established as 100Ω.

The electrostatic capacitances $C_{301}$ through $C_{304}$ and $C_{307}$ through $C_{310}$ of the dividing capacitors 32a through 32d and 32g through 32j, which satisfy the above inequalities (5-1) and (5-2), are established as $C_{301} = C_{303} = C_{304} = C_{307} = C_{308} = C_{310} = 2$ μF, $C_{302} = C_{309} = 1.5$ μF.

In the sixth inventive example, the reference line 24ref is positioned centrally in the module array 14. As shown in FIG. 22, in the first dividing capacitor group 36a, $k_1$ corresponds to the capacitor 32d having an electrostatic capacitance $C_{304}$, and $k_2$ corresponds to the capacitor 32b having an electrostatic capacitance $C_{302}$. In the second dividing capacitor group 36b, $k_1$ corresponds to the capacitor 32c having an electrostatic capacitance $C_{303}$, and $k_2$ corresponds to the capacitor 32a having an electrostatic capacitance $C_{301}$. In the third dividing capacitor group 36c, $k_1$ corresponds to the capacitor 32g having an electrostatic capacitance $C_{307}$, and $k_2$ corresponds to the capacitor 32i having an electrostatic capacitance $C_{309}$. In the fourth dividing capacitor group 36d, $k_1$ corresponds to the capacitor 32h having an electrostatic capacitance $C_{308}$, and $k_2$ corresponds to the capacitor 32j having an electrostatic capacitance C.

The resistance values $R_{300}$ through $R_{303}$ and $R_{307}$ through $R_{310}$ of the resistors 30a through 30d and 30g through 30j, which are paired with the dividing capacitors 32a through 32d and 32g through 32j, are established based on equations (5-3), (5-4), and (5-5) and the electrostatic capacitances $C_{301}$ through $C_{304}$ and $C_{307}$ through $C_{310}$. More specifically, $R_{300} = R_{310} = 114Ω$, $R_{301} = R_{309} = 133Ω$, $R_{302} = R_{308} = 136Ω$, and $R_{303} = R_{307} = 143Ω$ (rounded off to whole numbers).

In the dividing capacitor group 36a, the number $L_{k1}$ corresponding to the capacitor 32d having the electrostatic capacitance $C_{304}$ is represented by 2, and the number $L_{k2}$ corresponding to the capacitor 32b having the electrostatic capacitance $C_{302}$ is represented by 4. In the second dividing capacitor group 36b, the number $L_{k1}$ corresponding to the capacitor 32c having the electrostatic capacitance $C_{303}$ is represented by 3, and the number $L_{k2}$ corresponding to the capacitor 32a having the electrostatic capacitance $C_{301}$ is represented by 5. In the third dividing capacitor group 36c, the number $L_{k1}$ corresponding to the capacitor 32g having the electrostatic capacitance $C_{307}$ is represented by 2, and the number $L_{k2}$ corresponding to the capacitor 32i having the electrostatic capacitance $C_{309}$ is represented by 4. In the fourth dividing capacitor group 36d, the number $L_{k1}$ corresponding to the capacitor 32h having the electrostatic capacitance $C_{308}$ is represented by 3, and the number $L_{k2}$ corresponding to the capacitor 32j having the electrostatic capacitance $C_{310}$ is represented by 5.

With the arrangement shown in FIG. 22, it is possible to realize a certain time constant $\tau$ and to make the frequency characteristics of the RC filters uniform, as shown in FIG. 7.

C-3-4. Seventh Inventive Example

As described above, the reference line 24ref need not necessarily be a single reference line, but may be a plurality of reference lines. In other words, if both non-dividing capacitors 32nd and dividing capacitors 32div can be realized, then a plurality of reference lines 24ref may be provided. All or some of the non-dividing capacitors 32nd can share the same reference line 24ref, or the non-dividing capacitors 32nd can be associated with different respective reference lines 24ref. In order to realize the dividing capacitors 32div, at least two capacitors 32 may be associated with a single reference line 24ref. Therefore, the total number of reference lines 24ref can range from 1 to a number produced by subtracting 1 from the total number p of the capacitors 32.

Figure 23:
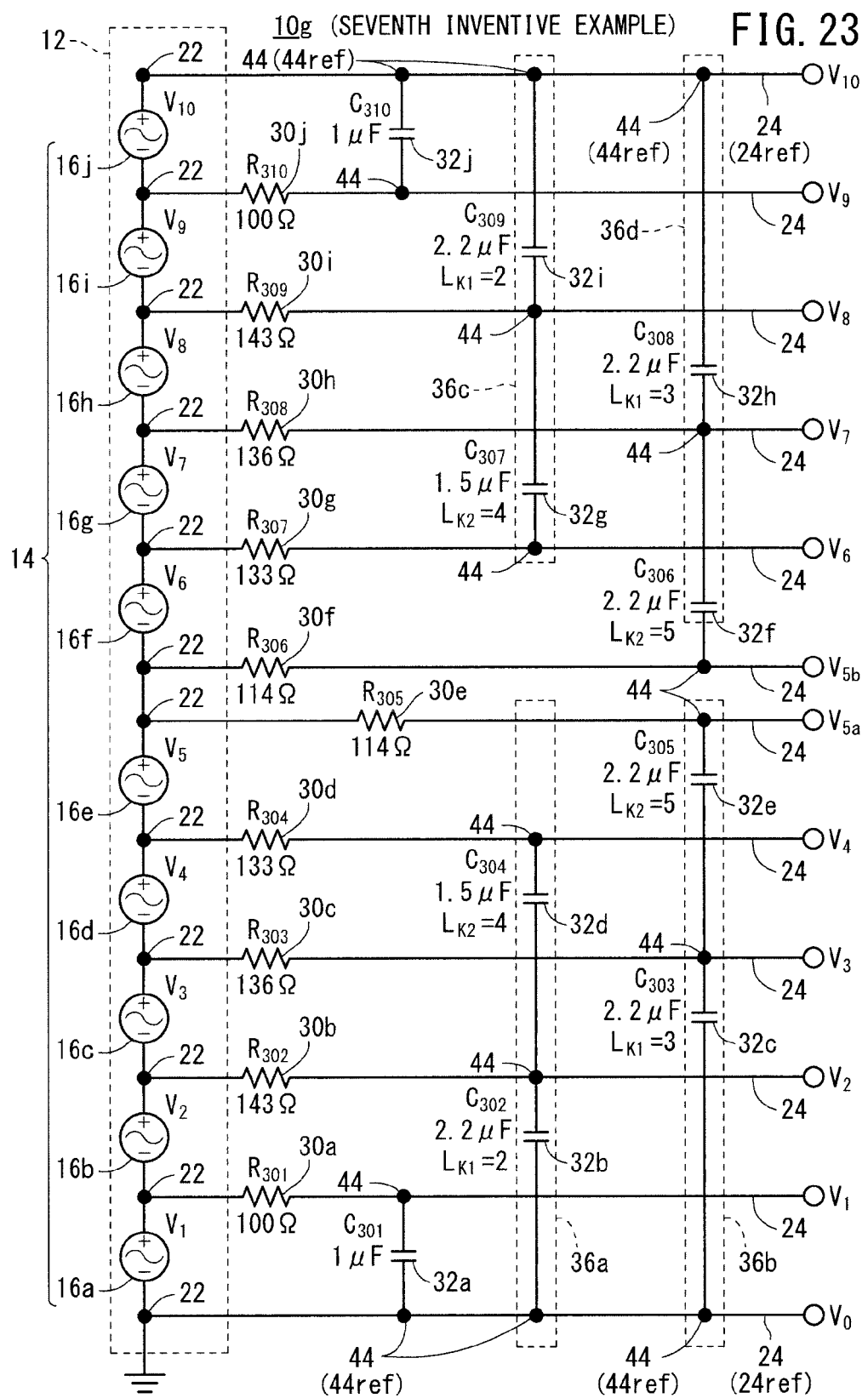
FIG. 23 is a diagram showing a specific example (seventh inventive example) of numerical values of resistors and capacitors in an arrangement (modification of FIG. 19), which makes use of positive-most and negative-most pole lines of a module array as reference lines, and which has four dividing capacitor groups (series-connected capacitor groups).

FIG. 23 is a diagram showing a specific example (seventh inventive example) of numerical values for the resistors 30 (30a through 30j) and the capacitors 32 (32a through 32j) in an arrangement (modification of FIG. 19) that uses positive-most and negative-most pole lines of the module array 14 as reference lines 24ref, and which has four dividing capacitor groups 36 (series-connected capacitor groups 36).

As shown in FIG. 23, a voltage measuring device 10g according to the seventh inventive example has capacitors 32a, 32j, which serve as non-dividing capacitors 32nd (first capacitors 32nd), and capacitors 32b through 32i, which serve as dividing capacitors 32div (second capacitors 32div) used in combination. The dividing capacitors 32b, 32d make up a first dividing capacitor group 36a (first series-connected capacitor group 36a). The dividing capacitors 32c, 32e make up a second dividing capacitor group 36b (second series-connected capacitor group 36b). The dividing capacitors 32g, 32i make up a third dividing capacitor group 36c (third series-connected capacitor group 36c). The dividing capacitors 32f, 32h make up a fourth dividing capacitor group 36d (fourth series-connected capacitor group 36d). Consequently, it is possible to increase the degree of freedom with which the RC filters are designed, while at the same time lowering withstand voltage limits for the dividing capacitors 32b through 32i.

Since the voltage measuring device 10g shown in FIG. 23 has two reference lines 24ref, the total number of lines 24 is represented by the number of modules +2. More specifically, two lines 24 are connected between the modules 16e and 16f.

The voltage measuring device 10g shown in FIG. 23 is designed according to the following sequence, for example. First, a required time constant τ is established. According to the seventh inventive example, τ=100 μsec.

Thereafter, electrostatic capacitances $C_{30n}$ of the capacitors 32 are determined. According to the seventh inventive example, the product of the electrostatic capacitances $C_{301}$, $C_{310}$ of the non-dividing capacitors 32a, 32j and the resistance values $R_{301}$, $R_{310}$ of the resistors 30a, 30j, which are paired with the non-dividing capacitors 32a, 32j, is represented by τ. Therefore, the electrostatic capacitances $C_{301}$, $C_{310}$ of the non-dividing capacitors 32a, 32j can be established comparatively freely. According to the seventh inventive example, each of the electrostatic capacitances $C_{301}$, $C_{310}$ of the non-dividing capacitors 32a, 32j is established as 1 μF. Accordingly, each of the resistance values $R_{301}$, $R_{310}$ of the resistors 30a, 30j, which are paired with the non-dividing capacitors 32a, 32j, is established as 100Ω.

The electrostatic capacitances $C_{302}$ through $C_{309}$ of the dividing capacitors 32b through 32i, which satisfy the above inequalities (5-1) and (5-2), are established as $C_{302}=C_{303}=C_{305}=C_{306}=C_{308}=C_{309}=2.2$ μF, $C_{304}=C_{307}=1.5$ μF.

In the seventh inventive example, the reference lines 24ref are positioned at uppermost and lowermost positions in FIG. 23. In the first dividing capacitor group 36a shown in FIG. 23, $k_1$ corresponds to the capacitor 32b having an electrostatic capacitance $C_{302}$, and $k_2$ corresponds to the capacitor 32d having an electrostatic capacitance $C_{304}$. In the second dividing capacitor group 36b, $k_1$ corresponds to the capacitor 32c having an electrostatic capacitance $C_{303}$, and $k_2$ corresponds to the capacitor 32e having an electrostatic capacitance $C_{305}$. In the third dividing capacitor group 36c, $k_1$ corresponds to the capacitor 32i having an electrostatic capacitance $C_{309}$, and $k_2$ corresponds to the capacitor 32g having an electrostatic capacitance $C_{307}$. In the fourth dividing capacitor group 36d, $k_1$ corresponds to the capacitor 32h having an electrostatic capacitance $C_{308}$, and $k_2$ corresponds to the capacitor 32f having an electrostatic capacitance $C_{306}$.

The resistance values $R_{302}$ through $R_{309}$ of the resistors 30b through 30i, which are paired with the dividing capacitors 32b through 32i, are established based on equations (5-3), (5-4), and (5-5) and the electrostatic capacitances $C_{302}$ through $C_{309}$. More specifically, $R_{302}=R_{309}=143Ω$, $R_{303}=R_{308}=136Ω$, $R_{304}=R_{307}=133Ω$, $R_{205}=R_{306}=114Ω$ (rounded off to whole numbers).

In the first dividing capacitor group 36a, the number $L_{k1}$ corresponding to the capacitor 32b having the electrostatic capacitance $C_{302}$ is represented by 2, and the number $L_{k2}$ corresponding to the capacitor 32d having the electrostatic capacitance $C_{304}$ is represented by 4. In the second dividing capacitor group 36b, the number $L_{k1}$ corresponding to the capacitor 32c having the electrostatic capacitance $C_{303}$ is represented by 3, and the number $L_{k2}$ corresponding to the capacitor 32e having the electrostatic capacitance $C_{305}$ is represented by 5. In the third dividing capacitor group 36c, the number $L_{k1}$ corresponding to the capacitor 32i having the electrostatic capacitance $C_{309}$ is represented by 2, and the number $L_{k2}$ corresponding to the capacitor 32g having the electrostatic capacitance $C_{307}$ is represented by 4. In the fourth dividing capacitor group 36d, the number $L_{k1}$ corresponding to the capacitor 32h having the electrostatic capacitance $C_{308}$ is represented by 3, and the number $L_{k2}$ corresponding to the capacitor 32f having the electrostatic capacitance $C_{306}$ is represented by 5.

With the arrangement shown in FIG. 23, similar to the case shown in FIG. 7, it is possible to realize a certain time constant τ and to make the frequency characteristics of the RC filters uniform.

C-4. Advantages of the Third Embodiment

According to the third embodiment, as described above, it is possible to increase the degree of design freedom for the RC filters (low-pass filters), while at the same time lowering withstand voltage limits for the capacitors 32 (dividing capacitors 32div).

More specifically, according to the third embodiment, the voltage measuring device includes a dividing capacitor group 36 having a plurality of dividing capacitors 32div, which are connected in series through measurement nodes 44. Therefore, compared with an arrangement in which all of the capacitors 32 are non-dividing capacitors 32nd, it is possible to reduce the withstand voltage limits for the dividing capacitors 32div that make up the dividing capacitor group 36.

According to the third embodiment, furthermore, the capacitors 32 included in the RC filters associated with the respective battery modules 16 can independently be placed as non-dividing capacitors 32nd or as dividing capacitors 32div included within the dividing capacitor group 36. Consequently, it is possible to increase the degree of freedom with which the capacitors 32 can be placed, compared with an arrangement in which all of the capacitors 32 are placed in series, i.e., an arrangement having only one dividing capacitor group 36 free of non-dividing capacitors 32nd.

According to the third embodiment, the electrostatic capacitances $C_{30x}$ of the dividing capacitors 32div satisfy the relationships represented by inequalities (5-1) and (5-2), whereas the resistance values $R_{30x}$ of the resistors 30 satisfy the relationships represented by equations (5-3), (5-4), and (5-5). Consequently, it is possible to make the frequency characteristics of the RC filters uniform. More specifically, with respect to the non-dividing capacitors 32nd and the resistors 30, which are paired with the non-dividing capacitors 32nd to make up the RC filters, the product of the electrostatic capacitances $C_{30x}$ of the non-dividing capacitors 32nd and the resistance values $R_{30x}$ of the resistors 30 serves as a time constant τ. Further, since the electrostatic capacitances $C_{30x}$ of the dividing capacitors 32div satisfy inequalities (5-1) and (5-2), and the resistance values $R_{30x}$ of the resistors 30 paired with the dividing capacitors 32div to make up the RC filters satisfy equations (5-3) through (5-5), the time constant τ of each of the RC filters is constant. Consequently, the RC filters, including any of the non-dividing capacitors 32nd and the dividing capacitors 32div, exhibit uniform filter frequency characteristics (filter time constants).

The electrostatic capacitances $C_{30x}$ of the dividing capacitors 32div satisfy inequalities (5-1) and (5-2). Therefore, by taking into account the term "$(L_{k2}-L_{k1})/L_{k1}$" in inequality (5-1) and the term "$(L_{k(m+1)}-L_{km})/(L_{km}-L_{k(m-1)})$" in inequality (5-2), it is possible to impart a relative degree of freedom to the electrostatic capacitances $C_{30x}$ of the dividing capacitors 32div, and to use inexpensive general-purpose capacitors for the dividing capacitors 32div. For example, it is possible to equalize the electrostatic capacitances $C_{30x}$ of the dividing capacitors 32div by setting the term "$(L_{k2}-L_{k1})/L_{k1}$" in inequality (5-1) and the term "$(L_{k(m+1)}-L_{km})/(L_{km}-L_{k(m-1)})$" in inequality (5-2) to numerical values greater than 0 and less than or equal to 1.

On the other hand, compared with the choices available for the electrostatic capacitances of general-purpose capacitors, the choices available for the resistance values of general-purpose resistors are greater. Trimmer resistors, the resistance values of which are adjustable as desired, are also generally available. In addition, it is easy to adjust the resistance values by combining series-connected resistors and parallel-connected resistors. Consequently, it is easier to satisfy equations (5-3) through (5-5) for the resistors 30 than to select the capacitors 32, thereby making it possible to minimize the cost of the voltage measuring device 10B.

D. Modifications

The present invention is not limited to the above-described embodiments and inventive examples, but may employ various arrangements based on the present description, the scope of the patent claims, and the details illustrated in the drawings. For example, the present invention may employ the following alternative arrangements.

In the above embodiments and inventive examples, each of the modules 16 is connected to a single voltage measuring circuit 18. However, two or more voltage measuring circuits 18 may be employed, insofar as the number of voltage measuring circuits 18 used is less than or equal to the number of modules.

In the above embodiments, general-purpose capacitors may be used as the capacitors 32. However, the capacitors 32 need not necessarily be general-purpose capacitors, but may be customized capacitors.

In the above embodiments and the inventive examples, each of the non-dividing capacitors 32nd and each of the dividing capacitors 32div are connected to the same poles of the modules 16. However, the present invention is not limited to such connections. In FIG. 23, the first dividing capacitor group 36a, the second dividing capacitor group 36b, and the non-dividing capacitor 32j may be excluded, and further, the modules 16b through 16e may be excluded, such that each of the non-dividing capacitors 32nd and each of the dividing capacitors 32div are connected to different poles of the modules 16.

The invention claimed is:

1. A voltage measuring device for measuring a voltage across a battery assembly having a plurality of series-connected battery modules each of which is made up of at least one cell, comprising:
   a plurality of measurement nodes including at least one reference node, which is maintained at a reference potential and is connected to one of the battery modules without being connected thereto through a resistor, and non-reference nodes other than the reference node;
   a plurality of voltage detector sections connected between adjacent ones of the measurement nodes in terms of potential magnitudes, wherein the voltage detector section detects a voltage between the reference node that is not connected to the resistor, and the non-reference node that is connected to the resistor;
   a plurality of resistors having respective ends connected to the non-reference nodes and respective other ends connected to junctions between the battery modules or to opposite ends of the battery assembly;
   at least one series capacitor group having:
   a first capacitor having one end connected to the reference node and another end connected to a first one of the non-reference nodes, and
   a second capacitor having one end connected to the first non-reference node and another end connected to a second one of the non-reference nodes, the potential magnitude between the second non-reference node and the reference node being greater than that between the first non-reference node and the reference node, and the second capacitor being connected in series to the first capacitor via the first non-reference node; and
   at least one non series capacitor having an end connected to the reference node and another end connected to a third one of the non-reference nodes, the potential magnitude between the third non-reference node and the reference node being smaller than that between the second non-reference node and the reference node, the third non-reference node being different from the first and second non-reference nodes and not being connected in series to the first or second capacitor.

2. A voltage measuring device for measuring a voltage across a battery assembly having a plurality of series-connected battery modules each of which is made up of at least one cell, comprising:
   a plurality of measurement nodes including at least one reference node, which is maintained at a reference potential and is connected to one of the battery modules without being connected thereto through a resistor, and non-reference nodes other than the reference node;
   a plurality of voltage detector sections connected between adjacent ones of the measurement nodes in terms of potential magnitudes;
   a plurality of resistors having respective ends connected to the non-reference nodes and respective other ends connected to junctions between the battery modules or to opposite ends of the battery assembly;
   at least one dividing capacitor group having a plurality of dividing capacitors connected in series through the measurement nodes, and having an end connected to the reference node and another end connected to one of the non-reference nodes; and
   at least one non-dividing capacitor having an end connected to the reference node and another end connected to one of the non-reference nodes to which the dividing capacitors are not connected, wherein product of the electrostatic capacitance of the non-dividing capacitor and a resistance value of one of the resistors, which is connected to the non-dividing capacitor to make up a low-pass filter, serves as a predetermined time constant τ;
   with respect to said at least one dividing capacitor group, number of the dividing capacitors is represented by n;
   an integer ranging from 2 to n−1 is represented by m;
   an integer ranging from 1 to n is represented by q;
   number of the dividing capacitors from the reference node to one of the dividing capacitors in question is represented by $k_q$;
   number of the non-reference nodes from the reference node to one of the non-reference nodes, which is connected to a terminal of a $k_q$th one of the dividing capacitors remote from the reference node, is represented by $L_{kq}$;

electrostatic capacitance of the $k_q$th one of the dividing capacitors is represented by $C_{kq}$; and a resistance value of one of the resistors, which is connected to the $k_q$th one of the dividing capacitors, is represented by $R_{kq}$;

then the electrostatic capacitance $C_{kq}$ of each of the dividing capacitors satisfies the following inequalities (1) and (2); and the resistance value $R_{kq}$ of each of the resistors satisfies the following equations (3) through (5):

$$C_{k1} > C_{k2} \cdot \frac{(L_{k2} - L_{k1})}{L_{k1}} \tag{1}$$

$$C_{km} > C_{k(m+1)} \cdot \frac{(L_{k(m+1)} - L_{km})}{(L_{km} - L_{k(m-1)})} \tag{2}$$

$$R_{k1} = \frac{\tau}{C_{k1} - \left\{ C_{k2} \cdot \frac{(L_{k2} - L_{k1})}{L_{k1}} \right\}} \tag{3}$$

$$R_{km} = \frac{\tau}{C_{km} \cdot \left\{ \frac{(L_{km} - L_{k(m-1)})}{L_{km}} \right\} - C_{k(m+1)} \cdot \left\{ \frac{(L_{k(m+1)} - L_{km})}{L_{km}} \right\}} \tag{4}$$

$$R_{kn} = \frac{\tau}{C_{kn} \cdot \left\{ \frac{(L_{kn} - L_{k(n-1)})}{L_{kn}} \right\}}. \tag{5}$$

3. A voltage measuring device for measuring a voltage across a battery assembly having a module array made up of a plurality of series-connected battery modules each of which is made up of at least one cell, comprising:

a voltage detecting unit for detecting voltages across the battery modules, the voltage detecting unit being connected to positive and negative pole sides of the battery modules through at least as many lines as number of the battery modules +1, the lines being connected to junctions between the battery modules and opposite ends of the module array;

as many resistors as the number of the battery modules, the resistors being connected to as many lines as the number of the battery modules, among the at least as many lines as the number of the battery modules +1; and as many capacitors as the number of the battery modules, which are combined with the resistors to make up RC filters;

wherein the capacitors include at least one capacitor not connected in series to other capacitors, and at least one series-connected capacitor group, wherein the at least one series-connected capacitor group comprises:

a first capacitor having an end connected to a reference line, which is free of any of the resistors and another end connected to a first non-reference line among the lines; and a second capacitor having one end connected to the first non-reference line and another end connected to a second non-reference line, the potential magnitude between the second non-reference line and the reference line being greater than that between the first non-reference line and the reference line, the second capacitor being connected in series to the first capacitor via the first non-reference line, and wherein the capacitor not connected in series to other capacitors has an end connected to the reference line and another end connected to a third non-reference line, the potential magnitude between the third non-reference line and the reference line being smaller than that between the second non-reference line and the reference line, the third non-reference line being different from the first and second non-reference lines.

4. The voltage measuring device according to claim 3, wherein if it is assumed that:

each of the RC filters has a time constant represented by a particular value $\tau$;

product of the electrostatic capacitance of the first capacitor and a resistance value of one of the resistors, which is paired with the first capacitor, is represented by $\tau$;

with respect to said at least one series-connected capacitor group, number of the second capacitors is represented by n;

an integer ranging from 2 to n−1 is represented by m;

an integer ranging from 1 to n is represented by q;

number of the second capacitors from the reference line to one of the second capacitors in question is represented by $k_q$;

number of the non-reference lines from the reference line to one of the non-reference lines, which is connected to a terminal of a $k_q$th one of the second capacitors remote from the reference line, is represented by $L_{kq}$;

electrostatic capacitance of the $k_q$th one of the second capacitors is represented by $C_{kq}$; and a resistance value of one of the resistors, which is connected to the $k_q$th one of the second capacitors, is represented by $R_{kq}$;

then the electrostatic capacitance $C_{kq}$ of each of the second capacitors satisfies the following inequalities (6) and (7); and the resistance value $R_{kq}$ of each of the resistors satisfies the following equations (8) through (10):

$$C_{k1} > C_{k2} \cdot \frac{(L_{k2} - L_{k1})}{L_{k1}} \tag{6}$$

$$C_{km} > C_{k(m+1)} \cdot \frac{(L_{k(m+1)} - L_{km})}{(L_{km} - L_{k(m-1)})} \tag{7}$$

$$R_{k1} = \frac{\tau}{C_{k1} - \left\{ C_{k2} \cdot \frac{(L_{k2} - L_{k1})}{L_{k1}} \right\}} \tag{8}$$

$$R_{km} = \frac{\tau}{C_{km} \cdot \left\{ \frac{(L_{km} - L_{k(m-1)})}{L_{km}} \right\} - C_{k(m+1)} \cdot \left\{ \frac{(L_{k(m+1)} - L_{km})}{L_{km}} \right\}} \tag{9}$$

$$R_{kn} = \frac{\tau}{C_{kn} \cdot \left\{ \frac{(L_{kn} - L_{k(n-1)})}{L_{kn}} \right\}}. \tag{10}$$

5. The voltage measuring device according to claim 1, wherein if it is assumed that:

product of the electrostatic capacitance of the non-dividing capacitor and a resistance value of one of the resistors, which is connected to the non-dividing capacitor to make up a low-pass filter, serves as a predetermined time constant $\tau$;

with respect to said at least one dividing capacitor group, number of the dividing capacitors is represented by n;

an integer ranging from 2 to n−1 is represented by m;

an integer ranging from 1 to n is represented by q;

number of the dividing capacitors from the reference node to one of the dividing capacitors in question is represented by $k_q$;

number of the non-reference nodes from the reference node to one of the non-reference nodes, which is connected to a terminal of a $k_q$th one of the dividing capacitors remote from the reference node, is represented by $L_{kq}$;

electrostatic capacitance of the $k_q$th one of the dividing capacitors is represented by $C_{kq}$; and a resistance value of one of the resistors, which is connected to the $k_q$th one of the dividing capacitors, is represented by $R_{kq}$;

then the electrostatic capacitance $C_{kq}$ of each of the dividing capacitors satisfies the following inequalities (1) and (2); and the resistance value $R_{kq}$ of each of the resistors satisfies the following equations (3) through (5):

$$C_{k1} > C_{k2} \cdot \frac{(L_{k2} - L_{k1})}{L_{k1}} \tag{1}$$

$$C_{km} > C_{k(m+1)} \cdot \frac{(L_{k(m+1)} - L_{km})}{(L_{km} - L_{k(m-1)})} \tag{2}$$

$$R_{k1} = \frac{\tau}{C_{k1} - \left\{ C_{k2} \cdot \frac{(L_{k2} - L_{k1})}{L_{k1}} \right\}} \tag{3}$$

$$R_{km} = \frac{\tau}{C_{km} \cdot \left\{ \frac{(L_{km} - L_{k(m-1)})}{L_{km}} \right\} - C_{k(m+1)} \cdot \left\{ \frac{(L_{k(m+1)} - L_{km})}{L_{km}} \right\}} \tag{4}$$

$$R_{kn} = \frac{\tau}{C_{kn} \cdot \left\{ \frac{(L_{kn} - L_{k(n-1)})}{L_{kn}} \right\}}. \tag{5}$$

\* \* \* \* \*